United States Patent
Oshiyama et al.

(10) Patent No.: US 9,835,685 B2
(45) Date of Patent: Dec. 5, 2017

(54) TEST CIRCUIT AND METHOD FOR CONTROLLING TEST CIRCUIT

(71) Applicant: FUJITSU LIMITED, Kawasaki-shi, Kanagawa (JP)

(72) Inventors: Gen Oshiyama, Kawasaki (JP); Takahiro Shikibu, Kawasaki (JP); Osamu Moriyama, Yokohama (JP); Iwao Yamazaki, Atami (JP); Akihiro Chiyonobu, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 89 days.

(21) Appl. No.: 14/954,257

(22) Filed: Nov. 30, 2015

(65) Prior Publication Data
US 2016/0154057 A1   Jun. 2, 2016

(30) Foreign Application Priority Data
Dec. 2, 2014   (JP) .................................. 2014-244322

(51) Int. Cl.
*G01R 31/28* (2006.01)
*G01R 31/3177* (2006.01)
(Continued)

(52) U.S. Cl.
CPC . *G01R 31/3177* (2013.01); *G01R 31/318505* (2013.01); *G01R 31/318513* (2013.01);
(Continued)

(58) Field of Classification Search
CPC ........ G01R 31/3177; G01R 31/318505; G01R 31/318513; G11C 29/32; G11C 29/1201; H01L 25/0657; H01L 2924/0002
See application file for complete search history.

(56) References Cited

U.S. PATENT DOCUMENTS 4,672,639 A * 6/1987 Tanabe ................. H04L 7/0338
                                                            327/231
6,292,045 B1 * 9/2001 Bongiorno ............... G06F 1/08
                                                            327/298
(Continued)

FOREIGN PATENT DOCUMENTS

JP          62-169355        7/1987
JP          2002-185309      6/2002
(Continued)

OTHER PUBLICATIONS

Extended European Search Report dated Apr. 29, 2016 for corresponding European Patent Application No. 15196814.6, 7 pages.

*Primary Examiner* — Thien D Nguyen
(74) *Attorney, Agent, or Firm* — Fujitsu Patent Center

(57) ABSTRACT

A test circuit for testing a semiconductor device including semiconductor chips, includes: a test input terminal configured to receive data for testing the semiconductor device; signal paths provided between one semiconductor chip in the semiconductor chips and another semiconductor chip in the semiconductor chips, data supplied to the test input terminal being transmitted through the signal paths; a select signal generator, provided in the one semiconductor chip and coupled to the another semiconductor chip via the signal paths, configured to generate, when receiving data indicating expected values via one or more signal paths in the signal paths, a select signal indicating the one or more signal paths; and a path selector, provided in the at least one semiconductor chip and coupled to the signal paths, configured to select, based on the select signal, signal paths to be used at the time of testing the semiconductor device.

6 Claims, 11 Drawing Sheets

(51) Int. Cl.
*G01R 31/3185* (2006.01)
*G11C 29/12* (2006.01)
*H01L 25/065* (2006.01)
*G11C 29/32* (2006.01)

(52) U.S. Cl.
CPC .......... *G11C 29/1201* (2013.01); *G11C 29/32* (2013.01); *H01L 25/0657* (2013.01); *H01L 2924/0002* (2013.01)

(56) References Cited

U.S. PATENT DOCUMENTS

| | | | |
|---|---|---|---|
| 2002/0074609 | A1 | 6/2002 | Maruyama |
| 2003/0197515 | A1 | 10/2003 | Ishigaki |
| 2003/0223522 | A1* | 12/2003 | Fukushima ............ H04L 7/0338 375/354 |
| 2008/0028104 | A1 | 1/2008 | Tsuneki |
| 2008/0204091 | A1* | 8/2008 | Choo ....................... G11C 5/02 327/149 |
| 2009/0091333 | A1* | 4/2009 | Chung .................... H01L 22/22 324/538 |
| 2010/0225364 | A1* | 9/2010 | Choi ........................ G06F 1/10 327/109 |
| 2010/0295600 | A1 | 11/2010 | Kim et al. |
| 2011/0084758 | A1 | 4/2011 | Shibata et al. |
| 2011/0248740 | A1* | 10/2011 | Chung .................... H01L 22/22 324/762.01 |
| 2012/0313647 | A1* | 12/2012 | Carpenter ............ G11C 29/025 324/612 |
| 2014/0232434 | A1* | 8/2014 | Koazechi ................. G06F 1/08 327/40 |
| 2015/0234420 | A1* | 8/2015 | Lin .......................... G06F 1/08 327/292 |

FOREIGN PATENT DOCUMENTS

| | | |
|---|---|---|
| JP | 2003-309183 | 10/2003 |
| JP | 2004-317352 | 11/2004 |
| JP | 2011-81887 | 4/2011 |
| JP | 2013-105996 | 5/2013 |

* cited by examiner

TEST CIRCUIT AND METHOD FOR CONTROLLING TEST CIRCUIT

CROSS-REFERENCE TO RELATED APPLICATION

This application is based upon and claims the benefit of priority of the prior Japanese Patent Application No. 2014-244322, filed on Dec. 2, 2014, the entire contents of which are incorporated herein by reference.

FIELD

The embodiments discussed herein are related to a test circuit and a method for controlling a test circuit.

BACKGROUND

In a system in package (SiP), a plurality of semiconductor chips are embedded in a single package.

Related technology is disclosed in Japanese Laid-open Patent Publication No. 2004-317352, Japanese Laid-open Patent Publication No. 2011-81887, Japanese Laid-open Patent Publication No. 2013-105996, Japanese Laid-open Patent Publication No. 2003-309183, Japanese Laid-open Patent Publication No. 2002-185309, or Japanese Laid-open Patent Publication No. 62-169355.

SUMMARY

According to an aspect of the embodiments, test circuit for testing a semiconductor device including semiconductor chips, includes: a test input terminal configured to receive data for testing the semiconductor device from outside the semiconductor device; signal paths provided between at least one semiconductor chip included in the semiconductor chips and another semiconductor chip included in the semiconductor chips, data which is supplied to the test input terminal being transmitted through the signal paths; a select signal generator, provided in the at least one semiconductor chip and coupled to the another semiconductor chip via the signal paths, configured to generate, when receiving data indicating an expected value via one or more signal paths included in the signal paths, a select signal indicating the one or more signal paths which transmit the data indicating the expected value; and a path selector, provided in the at least one semiconductor chip and coupled to the signal paths, configured to select, based on the select signal, signal paths to be used at the time of testing the semiconductor device from among the signal paths.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
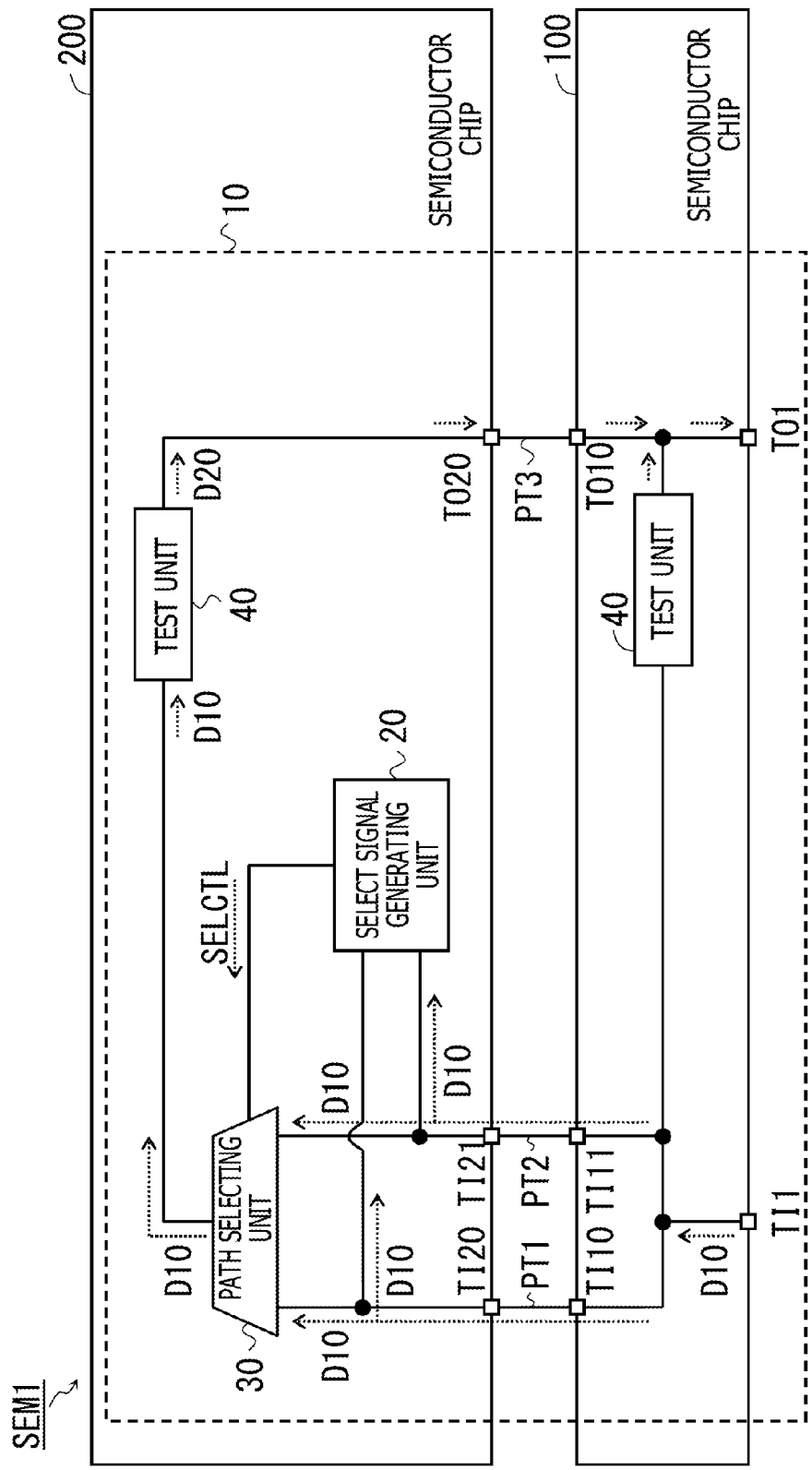
FIG. 1 illustrates an example of a test circuit.

Input/output terminals of a plurality of semiconductor chips are coupled to each other by bumps such as micro-bumps. In a semiconductor device in which a plurality of semiconductor chips are stacked, a failure may be caused in a signal path including an I/O terminal, a micro-bump or the like by manufacturing defects or the like of the micro-bump. For example, a failure in which a signal path including an I/O terminal, a micro-bump or the like is open, a failure in which wires adjacent to each other are short-circuited, or the like is caused. Accordingly, after two semiconductor chips are coupled to each other via a bump, a coupling between the semiconductor chips is tested.

A decrease of a yield (non-defective rate of a semiconductor chip) due to a bonding failure of micro-bumps increases the cost of an SiP. Therefore, for example, in a semiconductor device in which a plurality of semiconductor chips are stacked, a failure is avoided by bypassing a failure portion.

In order to detect a failure portion of a signal path between semiconductor chips, for example, a scan flip flop (a flip flop circuit designed for a scan test) which is provided in correspondence with each terminal of a test target is used. For example, in a test circuit formed in a semiconductor device, test data is set to a scan flip flop of one of the semiconductor chips coupled to each other via a scan chain or the like.

A test circuit transmits test data from a scan flip flop of one of semiconductor chips coupled to each other to a scan flip flop of the other of the semiconductor chips. The test data is retained in the scan flip flop of the other semiconductor chip. The test circuit acquires the test data retained in the scan flip flop of the other of the semiconductor chip via the scan chain or the like, and detects a failure portion of a signal path between semiconductor chips based on the acquired data.

A data retaining circuit in which an affection of malfunction of a flip flop circuit is reduced is provided by redundancy of the flip-flop circuit. For example, the data retaining circuit retains input data in three flip flops circuits, and outputs data according to a logic value which corresponds to a majority of output data of three flip flop circuits. In a semiconductor integrated circuit which is fabricated by using silicon on insulator (SOI) technology, a test circuit having a redundant configuration is provided.

A failure may be caused on a signal path for testing which is used when data is set in a scan flip flop circuit, a signal path for testing which is used when the data retained in the scan flip flop is acquired, or the like, among signal paths between chips coupled to each other. In this case, it may be difficult to perform a test for detecting a failure portion of a signal path between semiconductor chips. For example, if a failure occurs in a signal path for test, among signal paths between chips coupled to each other, the failure may not be avoided by bypassing a failure portion. Thus, yield of a semiconductor device may decrease, and a manufacturing cost of the semiconductor device may increase.

Arrows of dashed lines illustrated in the figures indicate a signal flow of data or the like.

FIG. 1 illustrates an example of a test circuit. A test circuit 10 tests a semiconductor device SEM1 that includes a plurality of semiconductor chips 100 and 200. The semiconductor device SEM1 may be a system in package (SiP) in which the plurality of semiconductor chips 100 and 200 are embedded in a single package. Input/output (I/O) terminals of the plurality of semiconductor chips 100 and 200 are coupled to each other by a bump such as a micro-bump.

The test circuit 10 includes terminals TI1, TI10, TI11, TI20, TI21, TO1, TO10, and TO20, a select signal generating unit 20, a path selecting unit 30, and a test unit 40.

The test input terminal TI1 is a test input terminal to which data for testing the semiconductor device SEM1 is input from the outside of the semiconductor device SEM1. The test output terminal TO1 is an output terminal from which data corresponding to test results of the respective semiconductor chips 100 and 200 is output to the outside of the semiconductor device SEM1. The test input terminal TI1 and the test output terminal TO1 correspond to external terminals of the semiconductor device SEM1. For example, the test input terminal TI1 and the test output terminal TO1 are disposed on a surface of the semiconductor chip 100, for example, a surface on which a logic circuit that performs a function of the semiconductor chip 100 is formed. The terminals TI10, TI11 and TO10 are disposed on a back surface of the semiconductor chip 100. Data that is supplied to the test input terminal TI1 is transmitted to the terminals TI10 and TI11 via a through-electrode or the like that passes through a substrate of the semiconductor chip 100. Data that is input to the terminal TO10 is transmitted to the test output terminal TO1 via the through-electrode or the like that passes through the substrate of the semiconductor chip 100. The terminals TI20, TI21, and TO20 are disposed on a surface of the semiconductor chip 200, and are respectively coupled to the terminals TI10, TI11 and TO10 via the bumps or the like.

For example, a signal path PT1 between the terminals TI10 and TI20 and a signal path PT2 between the terminals TI11 and TI21 are signal paths for test through which the data supplied to the test input terminal TI1 is transmitted. A signal path PT3 between the terminals TO10 and TO20 is a signal path for test through which the data supplied to the test output terminal TO1 is transmitted. Hereinafter, the signal paths for test PT1, PT2, and PT3 may be referred to as test paths. The test circuit 10 includes a plurality of test paths PT1 and PT2 through which the data supplied to the test input terminal TI1 is redundantly transmitted.

The select signal generating unit 20 is provided in the semiconductor chip 200 that is at least one of the plurality of semiconductor chips 100 and 200, and is coupled to another semiconductor chip 100 via the plurality of signal paths PT1 and PT2. For example, the select signal generating unit 20 receives data D10 with a logic value equal to a certain expected value from the test input terminal TI1 via another semiconductor chip 100 and the plurality of signal paths PT1 and PT2, and outputs select signals SELCTL to the path selecting unit 30.

For example, a test device that tests the semiconductor device SEM1 supplies the data D10 with a logic value equal to the expected value to the test input terminal TI1. The data D10 with a logic value equal to the expected value is transmitted to the select signal generating unit 20 from the test input terminals TI1 via the plurality of signal paths PT1 and PT2. The select signal generating unit 20 compares each of the data D10 which is received via the plurality of signal paths PT1 and PT2 with the expected value, and generates the select signal SELCTL, based on the comparison results.

For example, if a failure, for example, an open circuit, a short circuit, or the like of the micro-bump is caused in the signal path PT2, among the plurality of signal paths PT1 and PT2, the data D10 transmitted to the select signal generating unit 20 via the signal path PT2 does not coincide with the expected value. The data D10 transmitted to the select signal generating unit 20 via the signal path PT1 coincides with the expected value. In this case, the select signal generating unit 20 generates the select signals SELCTL indicating the signal path PT1. Upon receiving the data D10 indicating the expected value via one of the plurality of signal paths PT1 and PT2, the select signal generating unit 20 generates the select signals SELCTL indicating the signal paths PT through which the data D10 indicating the expected value is transmitted.

The path selecting unit 30 is disposed in the semiconductor chip 200 including the select signal generating unit 20, and is coupled to the plurality of signal paths PT1 and PT2. The path selecting unit 30 selects the signal paths PT which are used when the semiconductor device SEM1 is tested, among the plurality of signal paths PT1 and PT2, based on the select signal SELCTL. For example, if a failure occurs in the signal path PT2, among the plurality of signal paths PT1 and PT2, the path selecting unit 30 receives the select signal SELCTL indicating the signal path PT1 from the select signal generating unit 20.

In this case, the path selecting unit 30 selects the signal path PT1 indicating the select signal SELCTL, among the plurality of signal paths PT1 and PT2, as the signal paths PT between the test unit 40 of the semiconductor chip 200 and another semiconductor chip 100. The path selecting unit 30 transmits the data received from the test input terminals TI1 via the signal path PT1 to the test unit 40 of the semiconductor chip 200.

The test unit 40 is provided in each of the plurality of semiconductor chips 100 and 200, and tests the semiconductor device SEM1. For example, the test unit 40 of the semiconductor chip 200 tests the semiconductor chip 200, using the data transmitted from the path selecting unit 30. The test unit 40 of the semiconductor chip 200 transmits the data according to the test results to the test output terminal TO1 via the terminals TO20 and TO10. For example, the test unit 40 of the semiconductor chip 100 tests the semiconductor chip 100, using the data supplied to the test input terminal TI1. The test unit 40 of the semiconductor chip 100 transmits the data according to the test results to the test output terminal TO1.

In the test circuit 10, if one of the test paths PT1 and PT2 through which the data supplied to the test input terminal TI1 is transmitted fails, a test for detecting a failure portion of a signal path between the semiconductor chips 100 and 200 is performed. Therefore, the failure may be avoided by bypassing the failure portion. A decrease of yield due to a bonding failure between the semiconductor chips 100 and 200 may be suppressed, and a manufacturing cost of the semiconductor device SEM1 may be reduced.

For example, a test device that tests the semiconductor device SEM1 supplies the data D10 with a logic value equal to the expected value to the test input terminal TI1. After the path selecting unit 30 selects the signal paths PT that are used at the time of testing the semiconductor device SEM1, the test device supplies the data that tests the semiconductor device SEM1 to the test input terminal TI1. The test circuit 10 performs a test for detecting a failure portion of a signal path between the semiconductor chips 100 and 200, using the data supplied to the test input terminal TI1.

For example, in a configuration of the test circuit 10, the test paths PT (PT1, PT2) through which the data supplied to the test input terminal TI1 is transmitted may be configured by three or more redundant signal paths. For example, the test path PT3 may be redundant. In this case, the select signal generating unit 20 and the path selecting unit 30 which receive data through the redundant test path PT3, for example, the two test paths are provided in the semiconductor chip 100. For example, the test circuit 10 may be embedded in the semiconductor device SEM1 in which three semiconductor chips are stacked. In this case, the select signal generating unit 20 and the path selecting unit 30 may be provided in at least two of the three semiconductor chips. The test circuit 10 may be embedded in the semiconductor device SEM1 in which four or more semiconductor chips are stacked.

In FIG. 1, the test circuit 10 includes the path selecting unit 30 that receives the data supplied to the test input terminal TI1 via the plurality of signal paths PT1 and PT2. The path selecting unit 30 selects the signal paths PT that are used at the time of testing the semiconductor device SEM1, among the plurality of signal paths PT1 and PT2, based on the select signals SELCTL received from the select signal generating unit 20. Upon receiving the data D10 indicating the expected value via one of the plurality of signal paths PT1 and PT2, the select signal generating unit 20 generates the select signals SELCTL indicating the signal paths PT through which the data D10 indicating the expected value is transmitted.

If one of the signal paths PT1 and PT2 through which the data supplied to the test input terminal TI1 is transmitted fails, a test for detecting a failure portion of the signal path between the plurality of semiconductor chips 100 and 200 is performed. Therefore, the failure may be avoided by bypassing the failure portion. Yield of the semiconductor device SEM1 may increase.

For example, when the semiconductor device SEM1 is tested, if the test circuit 10 which verifies operations of the semiconductor chips CHIP does not perform a normal operation, it may be determined that a logic circuit does not operate, even if the logic circuit which realizes the functions of the semiconductor chips CHIP is normal. Since abnormality of a bonding portion which bonds the plurality of semiconductor chips CHIP is avoided, yield of the semiconductor device SEM1 may increase.

Figure 2:
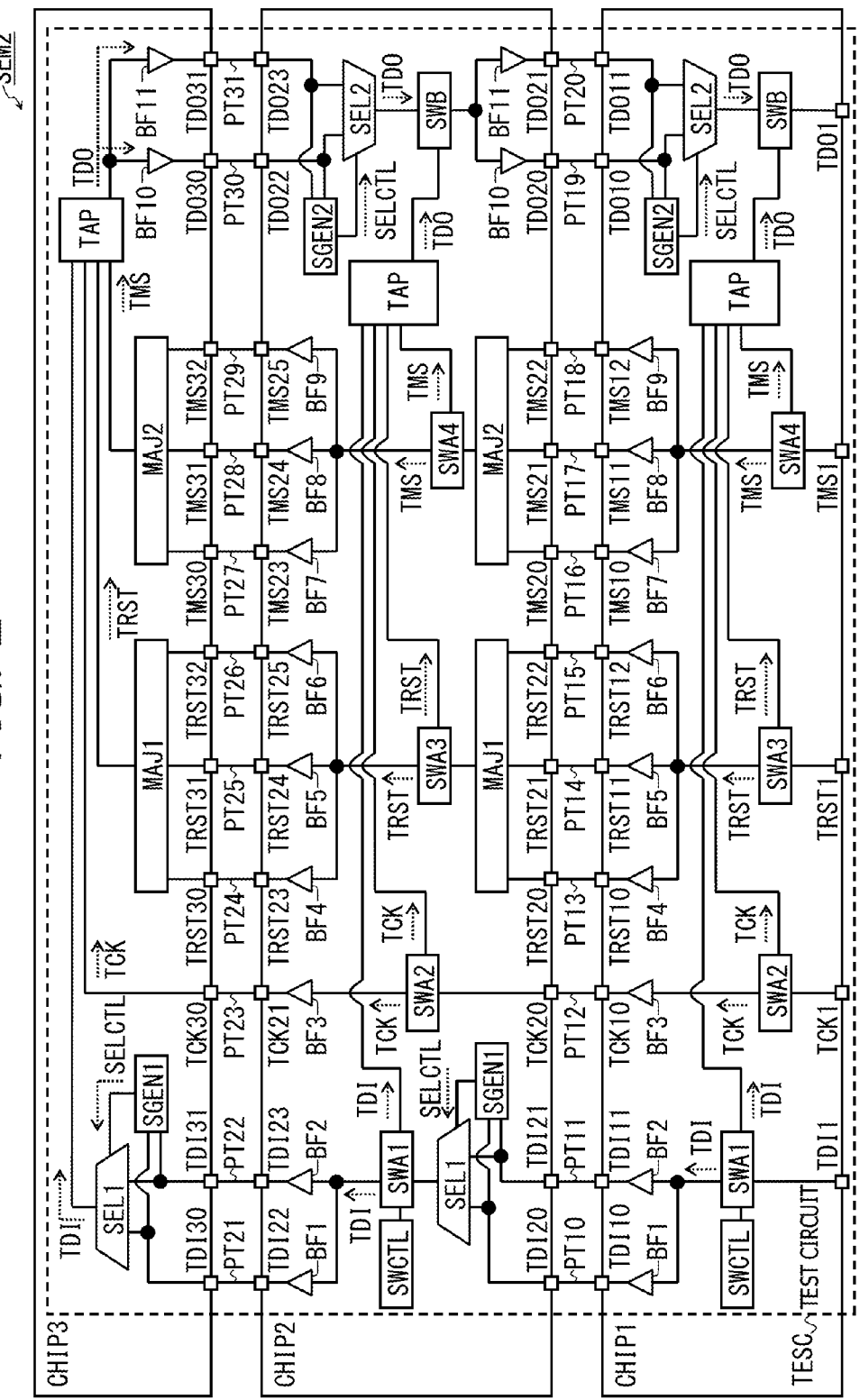
FIG. 2 illustrates another example of a test circuit.

FIG. 2 illustrates another example of a test circuit. In FIG. 2, the same or similar symbols or reference numerals will be attached to substantially the same elements as or similar elements to the elements illustrated in FIG. 1, and detailed description thereof will be omitted or reduced. A test circuit TESC tests a semiconductor device SEM2 which includes a plurality of semiconductor chips CHIP (CHIP1, CHIP2, CHIP3). The semiconductor device SEM2 may be an SiP in which the plurality of semiconductor chips CHIP are embedded in a single package. I/O terminals of the plurality of semiconductor chips CHIP are coupled to each other by bumps such as micro-bumps. For example, terminals which are disposed on a back surface of the semiconductor chip CHIP1 are bonded to terminals, which are disposed on a surface of the semiconductor chip CHIP2, by bumps. Terminals which are disposed on a back surface of the semiconductor chip CHIP2 are bonded to terminals, which are disposed on a surface of the semiconductor chip CHIP3, by bumps.

The surfaces of the respective semiconductor chips CHIP are surfaces on which logic circuits for realizing the function of the respective semiconductor chips CHIP are formed. The terminals disposed on the back surfaces of the respective semiconductor chips CHIP are coupled to the circuits or the like in the respective semiconductor chips CHIP via through-electrodes which pass through substrates of the respective semiconductor chips CHIP.

The semiconductor device SEM2 may accept a test method standardized by a joint test action group (JTAG) as, for example, IEEE1149.1. Hereinafter, IEEE1149.1 may be referred to as the JTAG. For example, terminals for interface signals TCK (test clock), TMS (test mode select), TRST (test reset), TDI (test data in), and TDO (test data out) which are referred to as TAP (test access port), are provided in the semiconductor device SEM2.

The test circuit TESC includes select signal generating units SGEN, path selecting units SEL, buffers BF, first switching units SWA, second switching units SWB, a switch control unit SWCTL, majority determination selecting units MAJ, and test units TAP corresponding to the JTAG. The test circuit TESC includes the terminals TDI, TDO, TCK, TMS, and TRST which are provided in the respective semiconductor chips CHIP.

A terminal TDI1 is a test input terminal which receives data TDI for testing the semiconductor device SEM2, for example, data scanned in the respective semiconductor chips CHIP from the outside of the semiconductor device SEM2. A terminal TDO1 is a test output terminal which outputs data TDO corresponding to the test results of the semiconductor chips CHIP, for example, data scanned out from the respective semiconductor chips CHIP to the outside of the semiconductor device SEM2. Hereinafter, the data TDI and TDO is referred to as signals TDI and TDO.

A terminal TCK1 is a test clock terminal which receives, for example, the clock signal TCK for testing (hereinafter, may be referred to as test clock TCK) from the outside of the semiconductor device SEM2.

A terminal TMS1 is a test mode select terminal which receives a signal TMS for selecting a test mode (hereinafter, may be referred to as a test mode select TMS) from the outside of the semiconductor device SEM2. A terminal TRST1 is a test reset terminal which receives a signal TRST for resetting a state of the test unit TAP (hereinafter, may be referred to as a test reset TRST) from the outside of the semiconductor device SEM2.

For example, the test input terminal TDI1, the test output terminal TDO1, the test clock terminal TCK1, the test mode select terminal TMS1, and the test reset terminal TRST1 correspond to the external terminals of the semiconductor device SEM2. For example, the test input terminal TDI1, the test output terminal TDO1, the test clock terminal TCK1, the test mode select terminal TMS1, and the test reset terminal TRST1 are disposed on a surface of the semiconductor chip CHIP1.

Terminals TDI10, TDI11, TDO10, TDO11, TCK10, TMS10, TMS11, TMS12, TRST10, TRST11, and TRST12 are disposed on a back surface of the semiconductor chip CHIP1. Terminals TDI20, TDI21, TDO20, TDO21, TCK20, TMS20, TMS21, TMS22, TRST20, TRST21, and TRST22 are disposed on a surface of the semiconductor chip CHIP2.

The terminals TDI20, TDI21, TDO20, and TDO21 are respectively coupled to the terminals TDI10, TDI11, TDO10, and TDO11 via bumps or the like. In addition, the terminals TCK20, TMS20, TMS21, TMS22, TRST20, TRST21, and TRST22 are coupled to the terminals TCK10, TMS10, TMS11, TMS12, TRST10, TRST11, and TRST12 via bumps or the like.

Terminals TDI22, TDI23, TDO22, TDO23, TCK21, TMS23, TMS24, TMS25, TRST23, TRST24, and TRST25 are disposed on a back surface of the semiconductor chip CHIP2. Terminals TDI30, TDI31, TDO30, TDO31, TCK30, TMS30, TMS31, TMS32, TRST30, TRST31, and TRST32 are disposed on a surface of the semiconductor chip CHIP3.

The terminals TDI30, TDI31, TDO30, and TDO31 are respectively coupled to the terminals TDI20, TDI21, TDO20, and TDO21 via bumps or the like. In addition, the terminals TCK30, TMS30, TMS31, TMS32, TRST30, TRST31, and TRST32 are coupled to the terminals TCK20, TMS20, TMS21, TMS22, TRST20, TRST21, and TRST22 via bumps or the like.

Signal paths PT10 to PT20 between the semiconductor chips CHIP1 and CHIP2, and signal paths PT21 to PT31 between the semiconductor chips CHIP2 and CHIP3 are signal paths for testing through which signals for testing, for example, interface signals such as the data TDI are transmitted. Hereinafter, the signal paths for testing PT10 to PT31 may be referred to as test paths.

For example, the signal path PT10 between the terminals TDI10 and TDI20 and the signal path PT11 between the terminals TDI11 and TDI21 are test paths between the semiconductor chips CHIP1 and CHIP2, through which the data TDI supplied to the test input terminal TDI1 is transmitted. The signal path PT21 between the terminals TDI22 and TDI30 and the signal path PT22 between the terminals TDI23 and TDI31 are test paths between the semiconductor chips CHIP2 and CHIP3, through which the data TDI supplied to the test input terminal TDI1 is transmitted. The test circuit TESC includes a plurality of test paths PT10, PT11, PT21, and PT22 through which the data TDI supplied to the test input terminal TDI1 is redundantly transmitted.

The semiconductor chip CHIP1 is a part of the test circuit TESC, and includes a switch control unit SWCTL, first switching units SWA1 to SWA4, a select signal generating unit SGEN2, a path selecting unit SEL2, a second switching unit SWB, the test unit TAP, and buffers BF1 to BF9.

A switch control signal (hereinafter, may be referred to as a control signal) which is output from the switch control unit SWCTL to the first switching unit SWA1 is determined by a state of the TAP controller in the test unit TAP. In FIG. 2, for the sake of easy viewing, signal lines between the switch control unit SWCTL and the first switching units SWA2 to SWA4, the second switching unit SWB, the test unit TAP, or the like may be omitted.

The first switching units SWA (SWA1 to SWA4) are set to one of an internal transmission state and a passing-through state, based on a control signal which is received from the switch control unit SWCTL. In the internal transmission state, data which is received by the first switching units SWA, for example, the data TDI of the first switching unit SWA1 is transmitted to the test units TAP of the semiconductor chips CHIP thereof. In the passing-through state, the data which is received by the first switching units SWA, for example, the data TDI in the first switching unit SWA1 is transmitted to another semiconductor chip CHIP.

Figure 4:
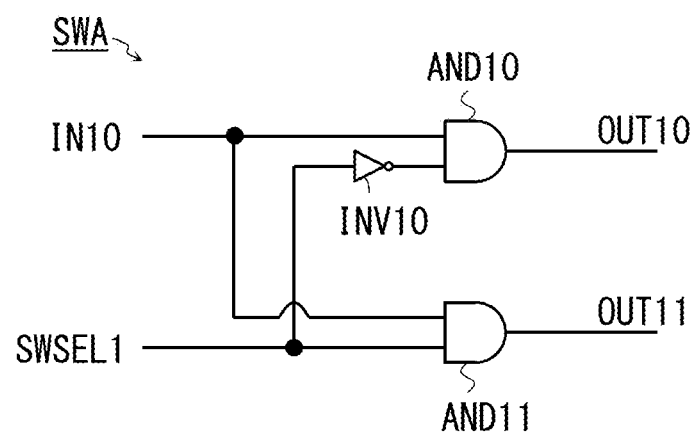
FIG. 4 illustrates an example of a first switching unit.

An input terminal of the first switching unit SWA1, for example, a terminal IN10 illustrated in FIG. 4 is coupled to the test input terminal TDI1. One of two output terminals of the first switching unit SWA1, for example, one of terminals OUT10 and OUT11 illustrated in FIG. 4 is coupled to the terminals TDI10 and TDI11 via the buffers BF1 and BF2, and the other of the two output terminals of the first switching unit SWA1 is coupled to the test unit TAP.

For example, if the control signal which is received from the switch control unit SWCTL indicates the internal transmission state, the first switching unit SWA1 transmits the data TDI transmitted from the test input terminal TDI1 to the test unit TAP of the semiconductor chip CHIP1. If the control signal which is received from the switch control unit SWCTL indicates the passing-through state, the first switching unit SWA1 transmits the data TDI transmitted from the test input terminal TDI1 to the semiconductor chips CHIP2 via the signal paths PT10 and PT11. Accordingly, the data TDI supplied to the test input terminal TDI1 is transmitted to a select signal generating unit SGEN1 and a path selecting unit SEL1 of the semiconductor chip CHIP2 via the plurality of signal paths PT10 and PT11.

An input terminal of the first switching unit SWA2 is coupled to the test clock terminal TCK1. One of two output terminals of the first switching unit SWA2 is coupled to the terminal TCK10 via the buffer BF3, and the other of the two output terminals of the first switching unit SWA2 is coupled to the test unit TAP.

An input terminal of the first switching unit SWA3 is coupled to the test reset terminal TRST1. One of two output terminals of the first switching unit SWA3 is coupled to the terminals TRST10, TRST11, and TRST12 via the buffers BF4, BF5, and BF6, respectively, and the other of the two output terminals of the first switching unit SWA3 is coupled to the test unit TAP.

An input terminal of the first switching unit SWA4 is coupled to the test mode select terminal TMS1. One of two output terminals of the first switching unit SWA4 is coupled to the terminals TMS10, TMS11, and TMS12 via the buffers BF7, BF8, and BF9, respectively, and the other of the two output terminals of the first switching unit SWA4 is coupled to the test unit TAP.

For example, if the first switching units SWA of the semiconductor chip CHIP1 are set to the internal transmission state, the test unit TAP of the semiconductor chip CHIP1 receives the signals TDI, TCK, TMS, and TRST from the terminals TDI1, TCK1, TMS1, and TRST1, respectively. If the first switching units SWA of the semiconductor chip CHIP1 are set to the passing-through state, the signals TDI, TCK, TMS, and TRST supplied to the terminals TDI1, TCK1, TMS1, and TRST1, respectively, are transmitted to the semiconductor chip CHIP2. Even if the first switching units SWA2 to SWA4 are set to the passing-through state, the signals TCK, TMS, and TRST may be transmitted to the test unit TAP of the semiconductor chips CHIP thereof.

The test unit TAP performs a test corresponding to the JTAG. The test unit TAP includes a TAP controller, a command register, a data register, and the like. The TAP controller in the test unit TAP is a state machine of a synchronization type which is controlled by the signals TCK, TMS, and TRST. For example, the TAP controller generates control signals of the command register, the data register, or the like, for example, a drive clock, based on the signals TCK, TMS, and TRST.

A state of the control signal which is output from the switch control unit SWCTL is controlled by a state transition (mode) of the TAP controller. One state of the control signal may be allocated to a plurality of modes of the TAP controller.

For example, the command register in the test unit TAP is used for selecting the data register which performs a scan operation. For example, the command register receives the data TDI indicating a command code or the like, and a control signal from the TAP controller. The command code is set in the command register. For example, the data TDI indicating the command code or the like is supplied to the test input terminal TDI1 from a test device which tests the semiconductor device SEM2.

The data register in the test unit TAP is a boundary scan register, a bypass register, or the like. For example, the data register receives a control signal from the TAP controller, and the data TDI supplied to the test input terminal TDI1, and retains the received data TDI. The data register transmits the retained data TDI to the test output terminal TDO1 as the data TDO. The test unit TAP transmits the data TDO corresponding to the test results of the semiconductor device SEM2 to the test output terminal TDO1.

Two input terminals of the select signal generating unit SGEN2 are coupled to the terminals TDO10 and TDO11. For example, the select signal generating unit SGEN2 of the semiconductor chip CHIP1 is coupled to the terminals TDO20 and TDO21 of the semiconductor chip CHIP2 via the signal paths PT19 and PT20, respectively.

For example, the select signal generating unit SGEN2 receives the data TDO with a logic value equal to a certain expected value from the test unit TAP of another semiconductor chip CHIP2 via the plurality of signal paths PT19 and PT20, and outputs the select signals SELCTL to the path selecting unit SEL2.

For example, if a failure occurs in the signal path PT20, among the plurality of signal paths PT19 and PT20, the select signal generating unit SGEN2 receives the data TDO with a logic value equal to the expected value via the signal path PT19. In this case, the select signal generating unit SGEN2 generates the select signals SELCTL indicating the signal path PT19, and outputs the generated select signals SELCTL to a control terminal of the path selecting unit SEL2.

If the select signal generating unit SGEN2 receives the data TDO indicating the expected value via one of the plurality of signal paths PT19 and PT20, the select signal generating unit SGEN2 generates the select signals SELCTL indicating the signal paths PT that transmits the data TDO indicating the expected value.

When the test paths PT are selected, the data TDO which is transmitted from the semiconductor chip CHIP2 to the semiconductor chip CHIP1 is data TDI transmitted to the test unit TAP of the semiconductor chip CHIP2 from the test input terminal TDI1 via the semiconductor chip CHIP1 or the like. Therefore, for example, the select signal generating unit SGEN2 receives the data TDO with a logic value equal to the certain expected value from the test input terminal TDI1 via another the semiconductor chip CHIP2 and the plurality of signal paths PT19 and PT20.

The two input terminals of the path selecting unit SEL2 are coupled to the terminals TDO10 and TDO11. For example, the path selecting unit SEL2 is coupled to the terminals TDO20 and TDO21 of the semiconductor chip CHIP2 via the signal paths PT19 and PT20, respectively.

The path selecting unit SEL2 selects the signal paths PT which are used at the time of testing the semiconductor device SEM2, among the plurality of signal paths PT19 and PT20, based on the select signal SELCTL. For example, if a failure occurs in the signal path PT20, among the plurality of signal paths PT19 and PT20, the path selecting unit SEL2 receives the select signals SELCTL indicating the signal path PT19 from the select signal generating unit SGEN2.

In this case, the path selecting unit SEL2 selects the signal path PT19 indicated by the select signal SELCTL, among the plurality of signal paths PT19 and PT20 as a signal path between the semiconductor chips CHIP1 and CHIP2. For example, the path selecting unit SEL2 transmits the data TDO received from the test unit TAP of another semiconductor chip CHIP2 via the signal path PT19 to the second switching unit SWB.

The second switching unit SWB is set to one of the internal transmission state and the passing-through state, based on the control signal received from the switch control unit SWCTL. In the internal transmission state, the second switching unit SWB transmits the data received from the test units TAP of the semiconductor chips CHIP thereof to the test output terminal TDO1. In addition, in the passing-through state, the second switching unit SWB transmits the data received from the test unit TAP of another semiconductor chip CHIP to the test output terminal TDO1.

Figure 5:
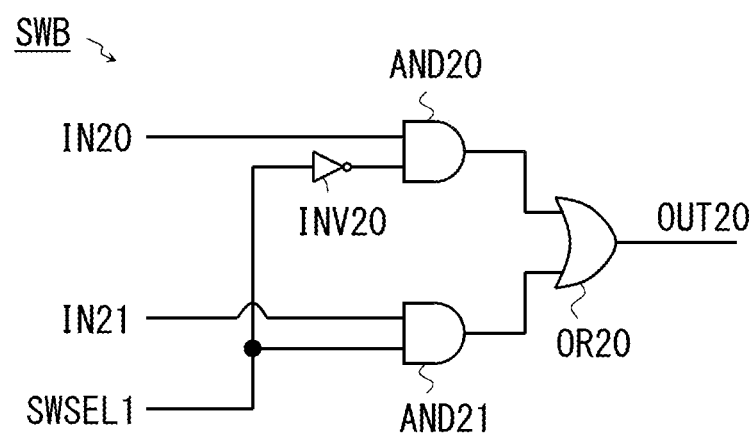
FIG. 5 illustrates an example of a second switching unit.

For example, one of two input terminals of the second switching unit SWB, for example, one of terminals IN20 and IN21 illustrated in FIG. 5 is coupled to the path selecting unit SEL2, and the other of the two input terminals the second switching unit SWB is coupled to the test unit TAP. An output terminal of the second switching unit SWB, for example, a terminal OUT20 illustrated in FIG. 5 is coupled to the test output terminal TDO1.

For example, if a control signal received from the switch control unit SWCTL indicates an internal transmission state, the second switching unit SWB transmits the data TDO transmitted from the test unit TAP to the test output terminal TDO1. If the control signal received from the switch control unit SWCTL indicates a passing-through state, the second switching unit SWB transmits the data TDO transmitted from the path selecting unit SEL2 to the test output terminal TDO1. The data TDO transmitted via the signal paths PT selected by the path selecting unit SEL2, among the plurality of signal paths PT19 and PT20, is transmitted to the test output terminal TDO1.

The semiconductor chip CHIP2 is a part of the test circuit TESC, and includes a switch control unit SWCTL, first switching units SWA1 to SWA4, a select signal generating unit SGEN2, a path selecting unit SEL2, a second switching unit SWB, a test unit TAP, and buffers BF1 to BF11. The semiconductor chip CHIP2 is a part of the test circuit TESC, and includes a select signal generating unit SGEN1, a path selecting unit SEL1, and majority determination selecting units MAJ1 and MAJ2.

The select signal generating unit SGEN1 may be substantially the same as or similar to the select signal generating unit SGEN2. The select signal generating unit SGEN1 receives the data TDI with a logic value equal to the certain expected value from the test input terminal TDI1 via another semiconductor chip CHIP1 and the plurality of signal paths PT10 and PT11, and outputs the select signals SELCTL to the path selecting unit SEL1.

For example, if a failure occurs in the signal path PT10, among the plurality of signal paths PT10 and PT11, the select signal generating unit SGEN1 receives the data TDI with a logic value equal to the expected value via the signal path PT11. In this case, the select signal generating unit SGEN1 generates the select signals SELCTL indicating the signal path PT11, and outputs the generated select signals SELCTL to a control terminal of the path selecting unit SEL1. In this way, if the select signal generating unit SGEN1 receives the data TDI indicating the expected value via one of the plurality of signal paths PT10 and PT11, the select signal generating unit SGEN1 generates the select signals SELCTL indicating the signal paths PT through which the data TDI indicating the expected value is transmitted.

The path selecting unit SEL1 may be substantially the same as or similar to the path selecting unit SEL2. For example, the path selecting unit SEL1 selects the signal paths PT which are used at the time of testing the semiconductor device SEM2, among the plurality of signal paths PT10 and PT11, based on the select signal SELCTL.

Two input terminals of the path selecting unit SEL1 are coupled to the terminals TDI20 and TDI21. For example, the path selecting unit SEL1 of the semiconductor chip CHIP2 is coupled to the terminals TDI10 and TDI11 of the semiconductor chip CHIP1 via the signal paths PT10 and PT11, respectively. An output terminal of the path selecting unit SEL1 is coupled to the first switching unit SWA1.

For example, if a failure occurs in the signal path PT10, among the plurality of signal paths PT10 and PT11, the path selecting unit SEL1 receives the select signals SELCTL indicating the signal path PT11 from the select signal generating unit SGEN1. In this case, the path selecting unit SEL1 selects the signal path PT11 indicated by the select signals SELCTL among the plurality of signal paths PT10 and PT11 as a signal path PT between the semiconductor chips CHIP1 and CHIP2. For example, the path selecting unit SEL1 transmits the data TDI received from the test input terminal TDI1 via the signal path PT11 to the first switching unit SWA1.

The switch control unit SWCTL may be substantially the same as or similar to the switch control unit SWCTL of the semiconductor chip CHIP1. The first switching units SWA (SWA1 to SWA4) may be substantially the same as or similar to the first switching units SWA of the semiconductor chip CHIP1.

An input terminal of the first switching unit SWA1 is coupled to an output terminal of the path selecting unit SEL1. One of two output terminals of the first switching unit SWA1 is coupled to the terminals TDI22 and TDI23 via the buffers BF1 and BF2, and the other of the two output terminals of the first switching unit SWA1 is coupled to the test unit TAP.

For example, the first switching unit SWA1 which is set to the internal transmission state transmits the data TDI transmitted from the path selecting unit SEL1 to the test unit TAP of the semiconductor chip CHIP2. The first switching unit SWA1 which is set to the passing-through state transmits the data TDI transmitted from the path selecting unit SEL1 to the select signal generating unit SGEN1 and the path selecting unit SEL1 of the semiconductor chip CHIP3 via the signal paths PT21 and PT22, respectively.

An input terminal of the first switching unit SWA2 is coupled to the terminal TCK20. One of two output terminals of the first switching unit SWA2 is coupled to the terminal TCK21 via the buffer BF3, and the other of the two output terminals of the first switching unit SWA2 is coupled to the test unit TAP.

An input terminal of the first switching unit SWA3 is coupled to the output terminal of the majority determination selecting unit MAJ1. One of two output terminals of the first switching unit SWA3 is coupled to the terminals TRST23, TRST24, and TRST25 via the buffers BF4, BF5, and BF6, respectively, and the other of the two output terminals of the first switching unit SWA3 is coupled to the test unit TAP.

An input terminal of the first switching unit SWA4 is coupled to the output terminal of the majority determination selecting unit MAJ2. One of two output terminals of the first switching unit SWA4 is coupled to the terminals TMS23, TMS24, and TMS25 via the buffers BF7, BF8, and BF9, respectively, and the other of the two output terminals of the first switching unit SWA4 is coupled to the test unit TAP.

The majority determination selecting units MAJ (MAJ1, MAJ2) output the data with a logic value equal to a logic value having the majority of the logic values of, for example, three of data received by three input terminals. For example, three input terminals of the majority determination selecting unit MAJ1 are respectively coupled to the terminals TRST20, TRST21, and TRST22, and an output terminal of the majority determination selecting unit MAJ1 is coupled to the input terminal of the first switching unit SWA3.

For example, if the signal path PT13 among the plurality of signal paths PT13, PT14, and PT15 fails, logic values of the data transmitted from the signal paths PT14 and PT15 have the majority of logic values of the data transmitted from the signal paths PT13, PT14, and PT15. In this case, the majority determination selecting unit MAJ1 transmits a signal TRST with a logic value equal to that of the data transmitted from the signal paths PT14 and PT15 to the first switching unit SWA3. Thus, even if one of the signal paths PT13, PT14, and PT15 fails, the semiconductor device SEM2 transmits the signal TRST from the semiconductor chip CHIP1 to the semiconductor chip CHIP2.

Three input terminals of the majority determination selecting unit MAJ2 are respectively coupled to the terminals TMS20, TMS21, and TMS22, and an output terminal of the majority determination selecting unit MAJ2 is coupled to the input terminal of the first switching unit SWA4. For example, if the signal path PT16 among the plurality of signal paths PT16, PT17, and PT18 fails, the majority determination selecting unit MAJ2 outputs a signal TMS with a logic value equal to that of the data transmitted from the signal paths PT17 and PT18 to the first switching unit SWA4. Thus, even if one of the signal paths PT16, PT17, and PT18 fails, in the semiconductor device SEM2, the signal TMS is transmitted from the semiconductor chip CHIP1 to the semiconductor chip CHIP2.

The select signal generating unit SGEN2, the path selecting unit SEL2, the second switching unit SWB and the test unit TAP may be substantially the same as or similar to the select signal generating unit SGEN2, the path selecting unit SEL2, the second switching unit SWB and the test unit TAP, respectively, in the semiconductor chip CHIP1.

Two input terminals of the select signal generating unit SGEN2 are coupled to terminals TDO22 and TDO23. For example, the select signal generating unit SGEN2 of the semiconductor chip CHIP2 is coupled to terminals TDO30 and TDO31 of the semiconductor chip CHIP3 via signal paths PT30 and PT31, respectively. An output terminal of the select signal generating unit SGEN2 is coupled to a control terminal of the path selecting unit SEL2.

Two input terminals of the path selecting unit SEL2 are coupled to the terminals TDO22 and TDO23. For example, the path selecting unit SEL2 is coupled to the terminals TDO30 and TDO31 of the semiconductor chip CHIP3 via the signal paths PT30 and PT31, respectively. An output terminal of the path selecting unit SEL2 is coupled to input terminals of the second switching unit SWB.

One of the two input terminals of the second switching unit SWB is coupled to the path selecting unit SEL2, and the other of the two input terminals of the second switching unit SWB is coupled to the test unit TAP. An output terminal of the second switching unit SWB is coupled to the terminals TDO20 and TDO21 via the buffers BF10 and BF11, respectively.

If the first switching units SWA of each of the semiconductor chips CHIP1 and CHIP2 are respectively set to the passing-through state and the internal transmission state, the data TDI supplied to the test input terminal TDI1 is transmitted to the test unit TAP of the semiconductor chip CHIP2. The signals TCK, TMS, and TRST supplied to the terminals TCK1, TMS1, and TRST1 are transmitted to the test unit TAP of the semiconductor chip CHIP2.

If the first switching units SWA of both the semiconductor chip CHIP1 and CHIP2 are set to the passing-through state, the signals TDI, TCK, TMS, and TRST supplied to the terminals TDI1, TCK1, TMS1, and TRST1 are transmitted to the semiconductor chip CHIP3.

If the second switching units SWB of each of the semiconductor chips CHIP1 and CHIP2 are set to the passing-through state and the internal transmission state, the data TDO transmitted from the test the test unit TAP of the semiconductor chip CHIP2 is transmitted to the test output terminal TDO1. If the second switching units SWB of both the semiconductor chips CHIP1 and CHIP2 are set to the passing-through state, the data TDO transmitted from the test unit TAP of the semiconductor chip CHIP3 is transmitted to the test output terminal TDO1.

The semiconductor chip CHIP3 is a part of the test circuit TESC, and includes a select signal generating unit SGEN1, a path selecting unit SEL1, majority determination selecting units MAJ1 and MAJ2, a test unit TAP, and buffers BF10 and BF11. The select signal generating unit SGEN1, the path selecting unit SEL1, and the majority determination selecting units MAJ1 and MAJ2 may be substantially the same as or similar to the select signal generating unit SGEN1, the path selecting unit SEL1, and the majority determination selecting units MAJ1 and MAJ2 of the semiconductor chip CHIP2, respectively. The test unit TAP may be substantially the same as or similar to the test unit TAP of the semiconductor chip CHIP2.

Two input terminals of the select signal generating unit SGEN1 are coupled to terminals TDI30 and TDI31. For example, the select signal generating unit SGEN1 of the semiconductor chip CHIP3 is coupled to the terminals TDI22 and TDI23 of the semiconductor chip CHIP2 via signal paths PT21 and PT22, respectively. An output terminal of the select signal generating unit SGEN1 is coupled to a control terminal of the path selecting unit SEL1.

Two input terminals of the path selecting unit SEL1 are coupled to the terminals TDI30 and TDI31. For example, the path selecting unit SEL1 of the semiconductor chip CHIP3 is coupled to the terminals TDI22 and TDI23 of the semiconductor chip CHIP2 via the signal paths PT21 and PT22, respectively. An output terminal of the path selecting unit SEL1 is coupled to the test unit TAP.

Three input terminals of the majority determination selecting unit MAJ1 are respectively coupled to the terminals TRST30, TRST31, and TRST32, and an output terminal of the majority determination selecting unit MAJ1 is coupled to the test unit TAP. Three input terminals of the majority determination selecting unit MAJ2 are respectively coupled to the terminals TMS30, TMS31, and TMS32, and an output terminal of the majority determination selecting unit MAJ2 is coupled to the test unit TAP.

The test unit TAP outputs the data TDO to the terminals TDO30 and TDO31 via the buffers BF10 and BF11, respectively. If the second switching units SWB of both the semiconductor chips CHIP1 and CHIP2 are set to the passing-through state, the data TDO output from the test unit TAP of the semiconductor chip CHIP3 is transmitted to the test output terminal TDO1.

If the first switching units SWA of both the semiconductor chips CHIP1 and CHIP2 are set to the passing-through state, the data TDI supplied to the test input terminal TDI1 is transmitted to the test unit TAP of the semiconductor chip CHIP3. The signals TCK, TMS, and TRST supplied to the terminals TCK1, TMS1, and TRST1 are transmitted to the test unit TAP of the semiconductor chip CHIP3.

In the test circuit TESC, for example, the switch control unit SWCTL may be provided inside the test unit TAP, for example, inside a TAP controller in the test unit TAP. The first switching unit SWA4 or the like may be omitted.

For example, the test paths PT (PT10, PT11) through which the data supplied to the test input terminal TI1 is transmitted may be redundant by three or more signal paths. For example, the test circuit TESC may be embedded in the semiconductor device SEM2 in which two semiconductor chips CHIP are stacked, for example, the semiconductor device SEM2 in which the semiconductor chip CHIP2 is omitted. The test circuit TESC may be embedded in the semiconductor device SEM2 in which four or more semiconductor chips CHIP are stacked.

Figure 3:
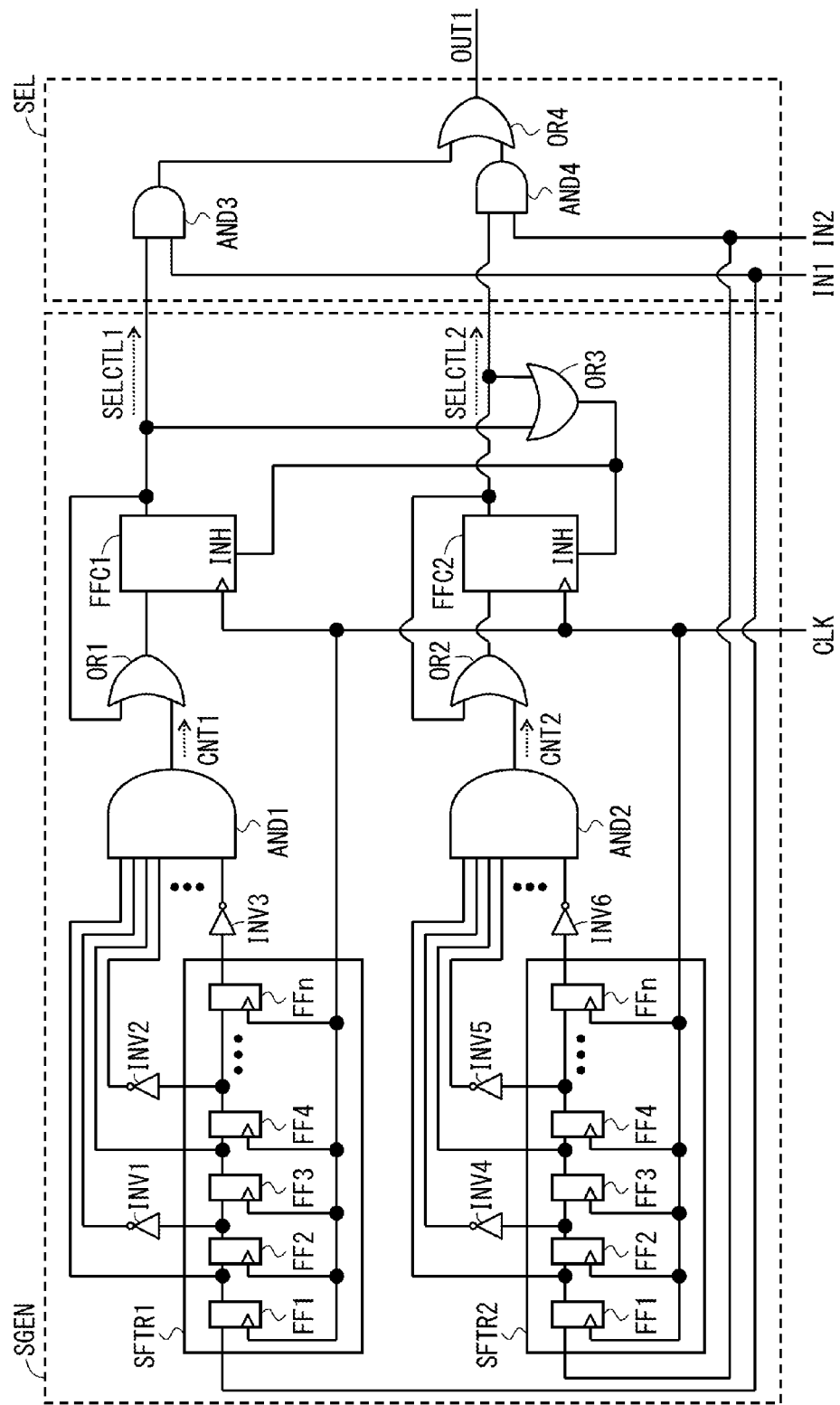
FIG. 3 illustrates an example of a select signal generating unit and a path selecting unit.

FIG. 3 illustrates an example of a select signal generating unit and a path selecting unit. The select signal generating unit and the path selecting unit which are illustrated in FIG. 3 may be the select signal generating unit SGEN and the path selecting units SEL illustrated in FIG. 2. A clock CLK that is supplied to a terminal CLK illustrated in FIG. 3 may be the clock signal TCK supplied to the test clock terminal TCK1 illustrated in FIG. 2, or a clock generated based on the clock signal TCK.

Terminals IN1 and IN2 are coupled to the terminals TDI20 and TDI21 in the select signal generating unit SGEN1 and the path selecting unit SEL1 of the semiconductor chip CHIP2. The terminals IN1 and IN2 are coupled to the terminals TDI30 and TDI31 in the select signal generating unit SGEN1 and the path selecting unit SEL1 of the semiconductor chip CHIP3.

The terminals IN1 and IN2 are coupled to the terminals TDO22 and TDO23 in the select signal generating unit SGEN2 and the path selecting unit SEL2 of the semiconductor chip CHIP2. The terminals IN1 and IN2 are coupled to the terminals TDO10 and TDO11 in the select signal generating unit SGEN2 and the path selecting unit SEL2 of the semiconductor chip CHIP1.

A terminal OUT1 is coupled to the first switching unit SWA1 or the like in the path selecting unit SEL1 of the semiconductor chip CHIP2. The terminal OUT1 is coupled to the test unit TAP in the path selecting unit SEL1 of the semiconductor chip CHIP3. The terminal OUT1 is coupled to the second switching units SWB in the path selecting unit SEL2 of the semiconductor chips CHIP1 and CHIP2.

The select signal generating unit SGEN1 includes shift registers SFTR1 and SFTR2 with n bits (n is an integer equal to or larger than 2), logical product circuits AND1 and AND2, logical sum circuits OR1, OR2, and OR3, and flip flop circuits FFC1 and FFC2.

The shift registers SFTR (SFTR1, SFTR2) may be an example of data storage units which respectively store data (data transmitted to the terminals IN1, IN2) received via a plurality of signal paths PT. For example, the shift registers SFTR operate in synchronization with the clock CLK supplied to the terminal CLK, and sequentially store the data transmitted to the terminals IN (IN1, IN2).

The shift registers SFTR respectively include n flip flop circuits FF (FF1, FF2, FF3, FF4, . . . , FFn) which operate in synchronization with the clock CLK supplied to the terminal CLK.

For example, an input terminal of the first flip flop circuit FF1 of the shift register SFTR1 is coupled to the terminal IN1. An input terminal of the first flip flop circuit FF1 of the shift register SFTR2 is coupled to the terminal IN2. An input terminal of each of the flip flop circuits FF2, FF3, FF4, . . . , and FFn is coupled to output terminals of the flip flop circuits FF of the previous stage.

Output terminals of the flip flop circuits FF of the odd stages of the shift register SFTR1 are coupled to an input terminal of the logical product circuit AND1, and output terminals of the flip flop circuits FF of the even stages are coupled to an input terminal of the logical product circuit AND1 via inverters INV.

For a certain input vector that is set, a logical inversion (inverter) is inserted such that an output of the logical product circuit AND1 increases by one. For example, the input vector may be set to "010101 . . . ", or "101010 . . . ".

The inverters INV output signals which are obtained by inverting signals received in the input terminals thereof. In FIG. 3, the output terminals of the flip flop circuits FF2, FF4, and FFn of the shift register SFTR1 are respectively coupled to input terminals of inverters INV1, INV2, and INV3. If the flip flop circuit FFn of the final stage is the flip flop circuits FF of the odd stages, the output terminal of the flip flop circuit FFn is coupled to the input terminal of the logical product circuit AND1.

Output terminals of the flip flop circuits FF of the odd stages of the shift register SFTR2 are coupled to an input terminal of the logical product circuit AND2, and output terminals of the flip flop circuits FF of the even stages are coupled to an input terminal of the logical product circuit AND2 via inverters INV. In FIG. 3, the output terminals of the flip flop circuits FF2, FF4, and FFn of the shift register SFTR2 are respectively coupled to input terminals of inverters INV4, INV5, and INV6. If the flip flop circuit FFn of the final stage is the flip flop circuits FF of the odd stages, the output terminal of the flip flop circuit FFn is coupled to the input terminal of the logical product circuit AND2.

The logical product circuits AND (AND1, AND2) may be an example of a first control unit that asserts control signals CNT (CNT1, CNT2) corresponding to the signal paths PT through which data indicating an expected value is transmitted. For example, the logical product circuit AND1 calculates a logical product of the data received in the n input terminals, and outputs the calculation results to the input terminal of the logical sum circuit OR1. In addition, the logical product circuit AND2 calculates a logical product of the data received in the n input terminals, and outputs the calculation results to the input terminal of the logical sum circuit OR2.

In FIG. 3, the data indicating the expected value is data with n bits in which logic values of odd-numbered bits (outputs of the flip flop circuits FF of the odd stages) are "1" and logic values of even-numbered bits (outputs of the flip flop circuits FF of the even stages) are "0".

For example, if outputs of the flip flop circuits FF of the odd stages and the even stages of the shift register SFTR1 respectively have a logic value "1" and a logic value "0", the logical product circuit AND1 outputs the control signal CNT1 with a logic value "1" to the logical sum circuit OR1. In the same manner, if outputs of the flip flop circuits FF of the odd stages and the even stages of the shift register SFTR2 respectively have a logic value "1" and a logic value "0", the logical product circuit AND2 outputs the control signal CNT2 with a logic value "1" to the logical sum circuit OR2.

The logical sum circuits OR1 and OR2 calculate a logical sum of the data received in the two input terminals, and outputs the calculation results. For example, the two input terminals of the logical sum circuit OR1 are respectively coupled to the output terminal of the logical product circuit AND1 and the output terminal of the flip flop circuit FFC1, and the output terminal of the logical sum circuit OR1 is coupled to the input terminals of the flip flop circuit FFC1. For example, the two input terminals of the logical sum circuit OR2 are respectively coupled to the output terminal of the logical product circuit AND2 and the output terminal of the flip flop circuit FFC2, and the output terminal of the logical sum circuit OR2 is coupled to the input terminal of the flip flop circuit FFC2.

If data with a logic value of "1" is stored in the flip flop circuit FFC1, the logical sum circuit OR1 receives the data with a logic value of "1" from the flip flop circuit FFC1. Therefore, if the data with a logic value of "1" is stored in the flip flop circuit FFC1, the logical sum circuit OR1 outputs the data with a logic value of "1" to the flip flop circuit FFC1 regardless of a logic value of the control signal CNT1.

In the same manner, if data with a logic value of "1" is stored in the flip flop circuit FFC2, the logical sum circuit OR2 receives the data with a logic value of "1" from the flip flop circuit FFC2. Therefore, if the data with a logic value of "1" is stored in the flip flop circuit FFC2, the logical sum circuit OR2 outputs the data with a logic value of "1" to the flip flop circuit FFC2 regardless of a logic value of the control signal CNT2.

The flip flop circuit FFC (FFC1, FFC2) may be an example of a select signal storage unit which stores logic values of each of a plurality of control signals CNT (CNT1, CNT2), and outputs the select signals SELCTL (SELCTL1, SELCTL2) based on the stored logic values. For example, the flip flop circuit FFC operates in synchronization with the clock CLK, and stores the data which is received in the input terminal. If terminal INH receives a signal with a logic value of "1", the flip flop circuit FFC prohibits input of the clock signal CLK. For example, during a time period in which a terminal INH receives a signal with a logic value of "1", the logic values of the data stored in the flip flop circuits FFC are not updated, even if the logic values of the data transmitted to the input terminals of the flip flop circuits FFC are changed.

The output terminal of the flip flop circuit FFC1 is coupled to the input terminals of the logical sum circuits OR1 and OR3 and the input terminal of the logical product circuit AND3. For example, the select signal SELCTL1 indicating a logic value of the data stored in the flip flop circuit FFC1 is transmitted to the logical sum circuits OR1 and OR3 and the logical product circuit AND3. The output terminal of the flip flop circuit FFC2 is coupled to the input terminals of the logical sum circuits OR2 and OR3 and the input terminal of the logical product circuit AND4. For example, the select signal SELCTL2 indicating the logic value of the data which is stored in the flip flop circuit FFC2 is transmitted to the logical sum circuit OR2 and OR3 and the logical product circuit AND4.

If logic values of the asserted control signals CNT are stored in a select signal storage unit, for example, the flip flop circuits FFC, the logical sum circuit OR3 may be an example of a second control unit which suppresses an update of the logic values stored in the select signal storage unit. For example, the logical sum circuit OR3 calculates a logical sum of the select signals SELCTL1 and SELCTL2 received in the two input terminals, and outputs the calculation results to the terminals INH of the flip flop circuits FFC1 and FFC2. For example, if the data with a logic value of "1" is stored in one of the flip flop circuits FFC1 and FFC2, the logical sum circuit OR3 suppresses the update of the logic values of the data stored in the respective flip flop circuits FFC1 and FFC2.

For example, if a failure occurs in the signal paths PT coupled to the terminal IN1 of the terminals IN1 and IN2, the control signal CNT1 is maintained as a negated state, and the control signal CNT2 is asserted. In this case, data with a logic value of "0" and data with a logic value of "1" are respectively stored in the flip flop circuits FFC1 and FFC2. The logical sum circuit OR3 receives the select signal SELCTL1 with a logic value of "0" from the flip flop circuit FFC1, and receives the select signal SELCTL2 with a logic value of "1" from the flip flop circuit FFC2. Therefore, the logical sum circuit OR3 outputs a signal with a logic value of "1" to the terminal INH of the flip flop circuits FFC1 and FFC2.

While the logical sum circuit OR3 outputs the signal with a logic value of "1" to the terminal INH of the flip flop circuits FFC1 and FFC2, the flip flop circuit FFC1 stops an update of the logic value of "0" of the stored data. In the same manner, while the logical sum circuit OR3 outputs the signal with a logic value of "1" to the terminal INH of the flip flop circuits FFC1 and FFC2, the flip flop circuit FFC2 stops an update of the logic value of "1" of the stored data.

Therefore, the select signals SELCTL1 and SELCTL2 are maintained as a logic value of "0" and a logic value "1". For example, during a time period after the select signals SELCTL indicating the signal paths PT through which the data indicating the expected value is transmitted are generated, the select signal generating unit SGEN may avoid the logic values of the select signals SELCTL1 and SELCTL2 from changing depending upon a change of the data transmitted to the terminals IN1 and IN2. The select signal generating unit SGEN stably supplies the select signals SELCTL indicating the signal paths PT through which the data indicating the expected value is transmitted to the path selecting unit SEL.

The path selecting unit SEL includes logical product circuits AND3 and AND4, and logical sum circuit OR4. The logical product circuits AND3 and AND4 calculate a logical product of data received in two input terminals, and output the calculation results.

The two input terminals of the logical product circuit AND3 are respectively coupled to the input terminal IN1 and the output terminals of the flip flop circuit FFC1. For example, the logical product circuit AND3 calculates a logical product of the select signal SELCTL1 received from the flip flop circuit FFC1 of the select signal generating unit SGEN and data received from the terminal IN1, and outputs the calculation results to the logical sum circuit OR4.

The two input terminals of the logical product circuit AND4 are respectively coupled to the input terminal IN2 and the output terminals of the flip flop circuit FFC2. For example, the logical product circuit AND4 calculates a logical product of the select signal SELCTL2 received from the flip flop circuit FFC2 of the select signal generating unit SGEN and data received from the terminal IN2, and outputs the calculation results to the logical sum circuit OR4.

The logical sum circuit OR4 calculates a logical sum of the data received in the two input terminals, for example, a logical sum of the output signals of the logical product circuits AND3 and AND4, and outputs the calculation results to the terminal OUT1.

For example, if a failure occurs in the signal paths PT coupled to the terminal IN1 of the terminals IN1 and IN2, the logical product circuit AND3 receives the select signal SELCTL1 of a logic value of "0" from the flip flop circuit FFC1 of the select signal generating unit SGEN. The logical product circuit AND3 outputs the data with a logical value of "0" to the logical sum circuit OR4, regardless of the logic value of the data transmitted to the terminal IN1.

If a failure occurs in the signal paths PT coupled to the terminal IN1 of the terminals IN1 and IN2, the logical product circuit AND4 receives the select signal SELCTL2 of a logic value of "1" from the flip flop circuit FFC2 of the select signal generating unit SGEN. The logical product circuit AND4 outputs the data with a logic value equal to the data transmitted to the terminal IN2 to the logical sum circuit OR4.

Therefore, if a failure occurs in the signal paths PT coupled to the terminal IN1 of the terminals IN1 and IN2, the logical sum circuit OR4 outputs the data with a logic value equal to the data transmitted to the terminal IN2 to the terminal OUT1.

For example, the select signal generating unit SGEN may include a negative logical sum circuit instead of the logical product circuits AND1 and AND2. In this case, the data indicating the expected value is data with n bits in which odd-numbered bits, for example, the logic values of the outputs of the flip flop circuits FF of the odd stages are "0" and even-numbered bits, for example, the logic values of the outputs of the flip flop circuits FF of the even stages are "1".

FIG. 4 illustrates an example of a first switching unit. The first switching unit illustrated in FIG. 4 may be the first switching unit SWA illustrated in FIG. 2. Each of the first switching units SWA (SWA1 to SWA4) includes a logical product circuits AND10 and AND11, an inverter INV10. The logical product circuits AND10 and AND11 calculate a logical product of data received in two input terminals thereof, and output the calculation results. The inverter INV10 outputs a signal which is obtained by inverting a signal received in an input terminal thereof.

The input terminal of the inverter INV10 is coupled to a terminal SWSEL1, and an output terminal of the inverter INV10 is coupled to one of the two input terminals of the logical product circuit AND10. The other of the two input terminals of the logical product circuit AND10 is coupled to a terminal IN10, and the output terminal of the logical product circuit AND10 is coupled to a terminal OUT10. Two input terminals of the logical product circuit AND11 are respectively coupled to the terminals IN10 and SWSEL1, and output terminal of the logical product circuit AND11 is coupled to a terminal OUT11.

For example, the terminal SWSEL1 receives a control signal from the switch control unit SWCTL. If the control signal received in the terminal SWSEL1 has a logic value of "0", a signal received in the terminal IN10 is output from the terminal OUT10. If the control signal received in the terminal SWSEL1 has a logic value of "1", a signal received in the terminal IN10 is output from the terminal OUT11.

For example, in the semiconductor chip CHIP2, the terminal IN10 of the first switching unit SWA1 is coupled to an output terminal of the path selecting unit SEL1. The terminal OUT10 is coupled to a test input terminal (terminal receiving the data TDI) of the test unit TAP, and the terminal OUT11 is coupled to the buffers BF1 and BF2.

FIG. 5 illustrates an example of a second switching unit. The second switching unit illustrated in FIG. 5 may be the second switching unit SWB illustrated in FIG. 2. The second switching unit SWB includes the logical product circuits AND20 and AND21, a logical sum circuit OR20, and an inverter INV20. The logical product circuits AND20 and AND21 calculate a logical product of data received in two input terminals thereof, and output the calculation results.

The logical sum circuit OR20 calculates a logical sum of data received in two input terminals thereof, and output the calculation results. The inverter INV20 outputs a signal which is obtained by inverting a signal received in an input terminal thereof.

The input terminal of the inverter INV20 is coupled to the terminal SWSEL1, and an output terminal of the inverter INV20 is coupled to one of two input terminals of the logical product circuit AND20. The other of the two input terminals of the logical product circuit AND20 is coupled to the terminal IN20. Two input terminals of the logical product circuit AND21 are respectively coupled to the terminals IN21 and SWSEL1. Two input terminals of the logical sum circuit OR20 are respectively coupled to the output terminals of the logical product circuits AND20 and AND21, and an output terminal of the logical sum circuit OR20 is coupled to a terminal OUT20.

For example, the terminal SWSEL1 receives a control signal from the switch control unit SWCTL. If the control signal received in the terminal SWSEL1 has a logic value of "0", a signal received in the terminal IN20 is output from the terminal OUT20. If the control signal received in the terminal SWSEL1 has a logic value of "1", a signal received in the terminal IN21 is output from the terminal OUT20.

For example, in the semiconductor chip CHIP2, the terminals IN20 and IN21 of the second switching unit SWB are respectively coupled to a test output terminal of the test unit TAP such as a terminal from which the data TDO is output, and the output terminal of the path selecting unit SEL2. The terminal OUT20 of the second switching unit SWB is coupled to the buffers BF10 and BF11.

Figure 6:
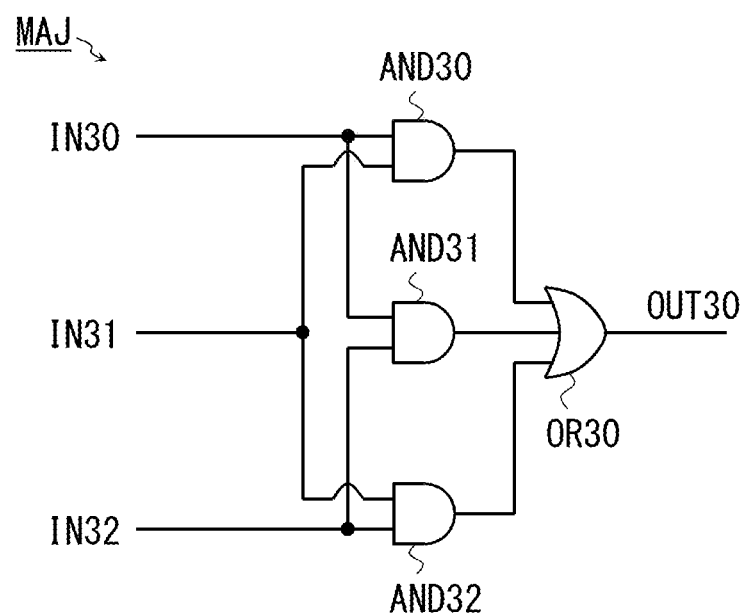
FIG. 6 illustrates an example of a majority determination selecting unit.

FIG. 6 illustrates an example of a majority determination selecting unit. The majority determination selecting unit illustrated in FIG. 6 may be the majority determination selecting units MAJ illustrated in FIG. 2. The majority determination selecting unit MAJ (MAJ1, MAJ2) includes logical product circuits AND30, and31, and AND32, and a logical sum circuit OR30. The logical product circuits AND30, and31, and AND32 calculate a logical product of data received in two input terminals thereof, and output the calculation results. The logical sum circuit OR30 calculates a logical sum of data received in three input terminals thereof, and outputs the calculation results.

The two input terminals of the logical product circuit AND30 are respectively coupled to terminals IN30 and IN31. The two input terminals of the logical product circuit AND31 are respectively coupled to the terminals IN30 and IN32. The two input terminals of the logical product circuit AND32 are respectively coupled to the terminals IN31 and IN32. The three input terminals of the logical sum circuit OR30 are respectively coupled to the output terminals of the logical product circuits AND30, AND31 and AND32, and the output terminal of the logical sum circuit OR30 is coupled to a terminal OUT30.

For example, if signals received in the terminals IN30 and IN31 have a logic value equal to each other, signals with a logic value equal to that of the signal received in the terminals IN30 and IN31 are output from the terminal OUT30. For example, if signals received in the terminals IN30 and IN32 have a logic value equal to each other, signals with a logic value equal to that of the signals received in the terminals IN30 and IN32 are output from the terminal OUT30. For example, if signals received in the terminals IN31 and IN32 have a logic value equal to each other, signals with a logic value equal to that of the signals received in the terminals IN31 and IN32 are output from the terminal OUT30.

For example, in the semiconductor chip CHIP2, the terminals IN30, IN31, and IN32 of the majority determination selecting unit MAJ1 are respectively coupled to the terminals TRST20, TRST21, and TRST22. The terminal OUT30 of the majority determination selecting unit MAJ1 is coupled to the input terminal of the first switching unit SWA3, for example, the terminal IN10 illustrated in FIG. 4.

Figure 7:
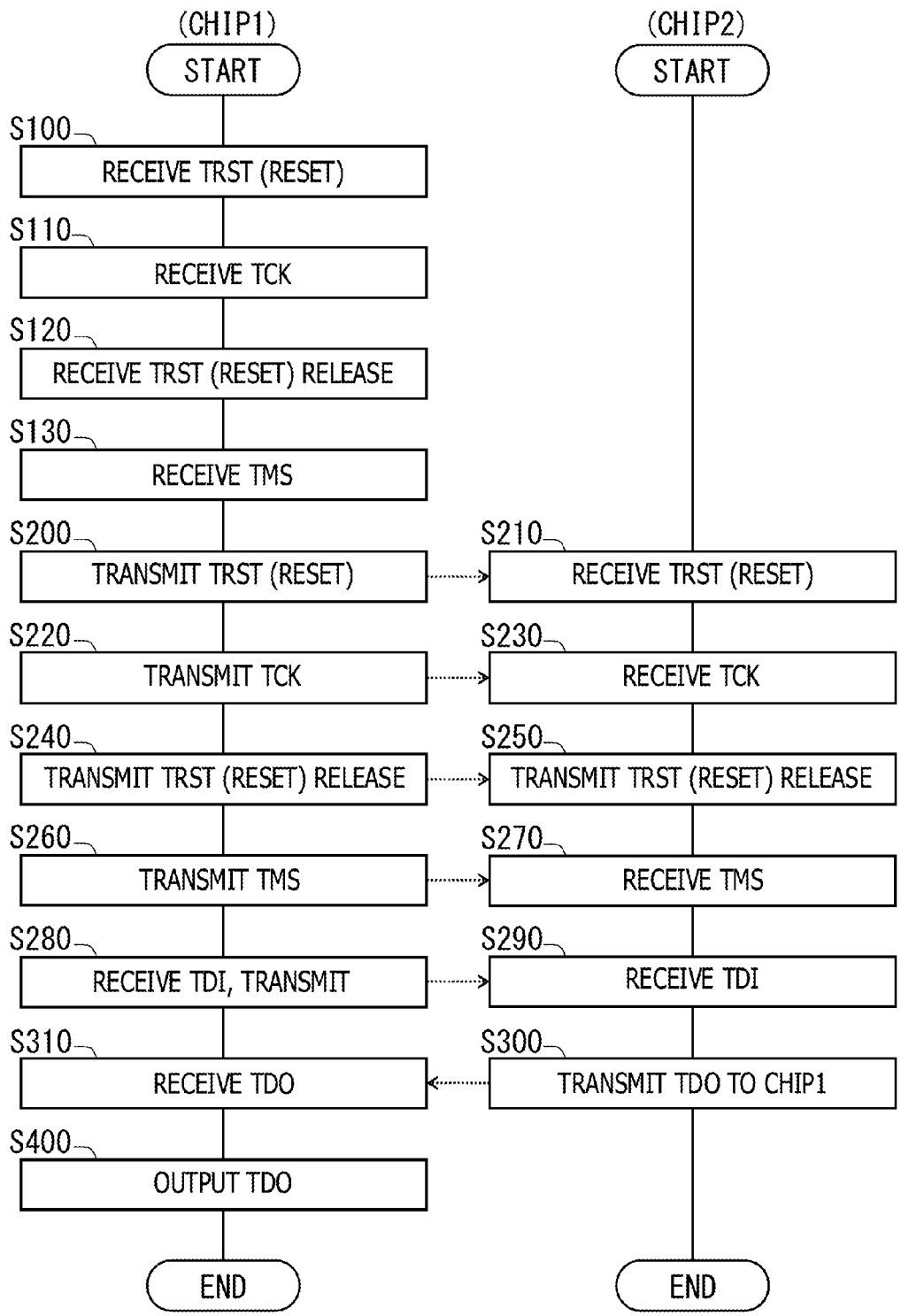
FIG. 7 illustrates an example of a control method of a test circuit.

FIG. 7 illustrates an example of a control method of a test circuit. In FIG. 7, a control method of the test circuit TESC illustrated in FIG. 2 is illustrated. In FIG. 7, a control method of the test circuit TESC at the time of setting the test paths PT between the semiconductor chips CHIP1 and CHIP2 is illustrated. Operations S100 to S130, S200, S220, S240, S260, S280, S310, and S400 illustrates an operation of the test circuit TESC included in the semiconductor chip CHIP1. Operations S210, S230, S250, S270, S290, and S300 illustrates an operation of the test circuit TESC included in the semiconductor chip CHIP2. The operations S130 to S270 illustrated in FIG. 7 illustrates a flow in which setting is performed from the semiconductor chips CHIP on a lower side to the semiconductor chips CHIP on an upper side, for example, an upper chip transmission sequence. The operations S260 to S400 correspond to a test of an actual circuit, for example, a test of the semiconductor device SEM2. For example, the operations illustrated in FIG. 7 may be controlled by a test device which tests the semiconductor device SEM2. In FIG. 7, an initial state of the first switching units SWA and an initial state of the second switching units SWB may be an internal transmission state.

In operation S100, the semiconductor chip CHIP1 receives the signal TRST which resets a state of the test unit TAP, at the test reset terminal TRST1. For example, the test device asserts the signal TRST which is supplied to the test reset terminal TRST1. Therefore, the asserted signal TRST is transmitted to the test unit TAP of the semiconductor chip CHIP1, and the state of the test unit TAP of the semiconductor chip CHIP1 is reset.

In operation S110, the semiconductor chip CHIP1 receives the test clock TCK which is supplied from the test device, at the test clock terminal TCK1. Therefore, the test clock TCK is transmitted to the test unit TAP of the semiconductor chip CHIP1.

In operation S120, the semiconductor chip CHIP1 receives the signal TRST which releases the reset, at the test reset terminal TRST1. For example, the test device negates the signal TRST which is supplied to the test reset terminal TRST1. Therefore, the negated signal TRST is transmitted to the test unit TAP of the semiconductor chip CHIP1, and processing of resetting the state of the test unit TAP of the semiconductor chip CHIP1 terminates.

In operation S130, the semiconductor chip CHIP1 receives the test mode select signal TMS which is supplied from the test device, at the test mode select terminal TMS1. Therefore, the test mode select signal TMS is transmitted to the test unit TAP of the semiconductor chip CHIP1, and the state of the test unit TAP is determined.

For example, the test device sets the state of the test unit TAP of the semiconductor chip CHIP1 to a state for setting the test paths PT between the semiconductor chips CHIP1 and CHIP2, using the test mode select signal TMS. The test device controls the switch control unit SWCTL by controlling a state of the TAP controller in the test unit TAP, and sets the first switching units SWA and the second switching units SWB of the semiconductor chip CHIP1 to a passing-through state.

The signals TDI, TCK, TMS, and TRST which are supplied from the test device to the terminals TDI1, TCK1, TMS1, and TRST1 are transmitted to the semiconductor chip CHIP2. The data TDO which is transmitted from the semiconductor chip CHIP2 is transmitted to the test output terminal TDO1.

In operation S200, the semiconductor chip CHIP1 receives the signal TRST which resets the state of the test unit TAP, at the test reset terminal TRST1, and transmits the received signal TRST to the semiconductor chip CHIP2 using the three signal paths PT13, PT14, and PT15. Therefore, the semiconductor chip CHIP2 receives the signal TRST which resets the state of the test unit TAP, in operation S210. For example, the test device asserts the signal TRST which is supplied to the test reset terminal TRST1. Therefore, the asserted signal TRST is transmitted to the test unit TAP of the semiconductor chip CHIP2 via the semiconductor chip CHIP1.

In operation S210, the semiconductor chip CHIP2 receives the signal TRST which resets the state of the test unit TAP, at the terminals TRST20, TRST21, and TRST22. Therefore, the majority determination selecting unit MAJ1 of the semiconductor chip CHIP2 receives the signal TRST which is transmitted via each of the three signal paths PT13, PT14, and PT15. The majority determination selecting unit MAJ1 determines logic values of the data which is transmitted to the first switching unit SWA3, among the logic values of the signals TRST which are transmitted via each of the three signal paths PT13, PT14, and PT15, based on a majority determination logic. Therefore, the signal TRST which resets the state of the test unit TAP, for example, the asserted signal TRST is transmitted to the test unit TAP of the semiconductor chip CHIP2, and the state of the test unit TAP of the semiconductor chip CHIP2 is reset.

In operation S220, the semiconductor chip CHIP1 transmits the test clock TCK which is supplied to the test clock terminal TCK1 to the semiconductor chip CHIP2. Therefore, the semiconductor chip CHIP2 receives the test clock TCK in operation S230.

In operation S230, the semiconductor chip CHIP2 receives the test clock TCK which is transmitted from the semiconductor chip CHIP1, at the terminal TCK20. Therefore, the test clock TCK is transmitted to the test unit TAP of the semiconductor chip CHIP2.

In operation S240, the semiconductor chip CHIP1 receives the signal TRST which releases the reset, at the test reset terminal TRST1, and transmits the received signal TRST to the semiconductor chip CHIP2 using the three signal paths PT13, PT14, and PT15. Therefore, the semiconductor chip CHIP2 receives the signal TRST which releases the reset, in operation S250. For example, the test device negates the signal TRST which is supplied to the test reset terminal TRST1. The negated signal TRST is transmitted to the test unit TAP of the semiconductor chip CHIP2 via the semiconductor chip CHIP1.

In operation S250, the semiconductor chip CHIP2 receives the signal TRST which releases the reset, at the terminals TRST20, TRST21, and TRST22. Therefore, the majority determination selecting unit MAJ1 of the semiconductor chip CHIP2 receives the signal TRST which is transmitted via each of the three signal paths PT13, PT14, and PT15. The majority determination selecting unit MAJ1 determines logic values of the data which is transmitted to the first switching unit SWA3, among the logic values of the signals TRST which are transmitted via each of the three signal paths PT13, PT14, and PT15, based on a majority determination logic. The signal TRST which released the reset, for example, the negated signal TRST is transmitted to the test unit TAP of the semiconductor chip CHIP2, and processing of resetting the state of the test unit TAP of the semiconductor chip CHIP2 terminates.

In operation S260, the semiconductor chip CHIP1 receives the test mode select signal TMS which is supplied from the test device, at the test mode select terminal TMS1. The semiconductor chip CHIP1 transmits the test mode select signal TMS which is received from the test device to the semiconductor chip CHIP2 using the three signal paths PT16, PT17, and PT18. Therefore, the semiconductor chip CHIP2 receives the test mode select signal TMS in operations S270.

In operation S270, the semiconductor chip CHIP2 receives the test mode select signal TMS, at the terminals TMS20, TMS21, and TMS22. Therefore, the majority determination selecting unit MAJ2 of the semiconductor chip CHIP2 receives the signal TMS which is transmitted via each of the three signal paths PT16, PT17, and PT18. The majority determination selecting unit MAJ2 determines logic values of the data which is transmitted to the first switching unit SWA4, among the logic values of the signals TMS which are transmitted via each of the three signal paths PT16, PT17, and PT18, based on a majority determination logic. Therefore, the test mode select signal TMS is transmitted to the test unit TAP of the semiconductor chip CHIP2, and the state of the test unit TAP is determined.

For example, the test device sets the state of the test unit TAP of the semiconductor chip CHIP2 to a state for setting the test paths PT between the semiconductor chips CHIP1 and CHIP2, using the test mode select signal TMS. The operation states of the first switching units SWA and the second switching units SWB of the semiconductor chip CHIP2 are maintained in an internal transmission state.

Therefore, the data TDI which is supplied to the test input terminal TDI1 from the test device is transmitted to a test unit of the semiconductor chip CHIP2. The data TDI which is transmitted to the test unit TAP of the semiconductor chip CHIP2 is transmitted to the test output terminal TDO1 as the data TDO.

In operation S280, the semiconductor chip CHIP1 receives the data TDI with a logic value equal to the expected value, at the test input terminal TDI1, and transmits the received data TDI to the semiconductor chip CHIP2 using the two signal paths PT10 and PT11. For example, the test device alternately transmits the data with a logic value of "0" and the data with a logic value of "1" to the test input terminal TDI1. Therefore, if one of the signal paths PT10 and PT11 is normal in operation S290, the semiconductor chip CHIP2 receives the data TDI with a logic value equal to the expected value.

In operation S290, the semiconductor chip CHIP2 receives the data TDI, at the terminals TDI20 and TDI21. Therefore, the select signal generating unit SGEN1 of the semiconductor chip CHIP2 receives the data TDI which is transmitted via each of the two signal paths PT10 and PT11. If the data TDI which is transmitted via each of the two signal paths PT10 and PT11 indicates the expected value, the select signal generating unit SGEN1 generates the select signals SELCTL indicating the signal paths PT through which the data TDI indicating the expected value is transmitted. For example, the select signal generating unit SGEN1 asserts the select signals SELCTL corresponding to the signal paths PT through which the data TDI indicating the expected value is transmitted, among the select signals SELCTL1 and SELCTL2.

The path selecting unit SEL1 of the semiconductor chip CHIP2 selects the signal paths PT which are used at the time of testing the semiconductor device SEM2, among the signal paths PT10 and PT11, based on the select signals SELCTL received from the select signal generating unit SGEN1. For example, the path selecting unit SEL1 selects the signal paths PT corresponding to the asserted select signal SELCTL. Therefore, the test paths PT between the semiconductor chips CHIP1 and CHIP2 at the time of transmitting the data TDI are set.

Since the test paths PT at the time of transmitting the data TDI are set, the data TDI transmitted from the semiconductor chip CHIP1, and the data TDI indicating the expected value are transmitted to the test unit TAP of the semiconductor chip CHIP2.

In operation S300, the semiconductor chip CHIP2 transmits the data TDI transmitted to the test unit TAP of the semiconductor chip CHIP2, for example, the data TDI indicating the expected value, to the semiconductor chip CHIP1 using the two signal paths PT19 and PT20 as the data TDO. Therefore, if one of the signal paths PT19 and PT20 is normal, the semiconductor chip CHIP1 receives the data TDO with a logic value equal to the expected value, in operation S310.

In operation S310, the semiconductor chip CHIP1 receives the data TDO, at the terminals TDO10 and TDO11. Therefore, the select signal generating unit SGEN2 of the semiconductor chip CHIP1 receives the data TDO transmitted via each of the two signal paths PT19 and PT20. If the data TDO received via one of the two signal paths PT19 and PT20 indicates the expected value, the select signal generating unit SGEN2 generates the select signals SELCTL indicating the signal paths PT through which the data TDO indicating the expected value is transmitted. For example, the select signal generating unit SGEN2 asserts the select signals SELCTL corresponding to the signal paths PT through which the data TDO indicating the expected value is transmitted, among the select signals SELCTL1 and SELCTL2.

The path selecting unit SEL2 of the semiconductor chip CHIP1 selects the signal paths PT which are used at the time of testing the semiconductor device SEM2, among the signal paths PT19 and PT20, based on the select signals SELCTL received from the select signal generating unit SGEN2. For example, the path selecting unit SEL2 selects the signal paths PT corresponding to the asserted select signal SELCTL. Therefore, the test paths PT between the semiconductor chips CHIP1 and CHIP2 at the time of transmitting the data TDO are set. Since the test paths PT at the time of transmitting the data TDO are set, the data TDO transmitted from the semiconductor chip CHIP2 is transmitted to the test output terminal TDO1.

In operation S400, the semiconductor chip CHIP1 outputs the data TDO received from the semiconductor chip CHIP2 to the test device via the test output terminal TDO1.

The test paths PT between the semiconductor chips CHIP1 and CHIP2 are set. Setting of the test paths PT between the semiconductor chips CHIP2 and CHIP3 may be performed after, for example, operation S400. For example, the test device controls the switch control unit SWCTL by controlling the state of the TAP controller in the test unit TAP, and sets the first switching unit SWA1 and the second switching unit SWB of the semiconductor chip CHIP2 to a passing-through state.

The test device makes the semiconductor chip CHIP1 perform substantially the same operations as or similar operations to the operations S200, S220, S240, S260, and S280, and makes the semiconductor chip CHIP3 perform substantially the same operations as or similar operations to the operations S210, S230, S250, S270, and S290. The test device makes the semiconductor chip CHIP3 perform substantially the same operation as or similar operations to operation S300, and makes the semiconductor chip CHIP1 perform substantially the same operations as or similar operations to operations S310 and S400. The test paths PT between the semiconductor chip CHIP2 and CHIP3 are set.

After the test paths PT between the plurality of semiconductor chips CHIP are set, the data TDI for testing the semiconductor device SEM2 is supplied to the test input terminal TDI1.

For example, if a test using the test unit of the semiconductor chip CHIP1 is performed, the test device does not transmit the data TDI or the like to the test unit of the semiconductor chips CHIP2 and CHIP3, and thus a malfunction of the test units TAP of the semiconductor chips CHIP2 and CHIP3 may be reduced. A collision between the data TDO which is output from the test unit TAP of the semiconductor chip CHIP1 and the data TDO which is transmitted from another semiconductor chip CHIP may be reduced.

If a test using the test unit TAP of the semiconductor chip CHIP2 is performed, for example, the test device sets the first switching units SWA and the second switching units SWB of the semiconductor chip CHIP1 to a passing-through state. The test device sets the first switching units SWA and the second switching units SWB of the semiconductor chip CHIP2 to an internal transmission state. Since the data TDI or the like is not transmitted to the test units TAP of the semiconductor chips CHIP1 and CHIP3, a malfunction of the test units TAP of the semiconductor chips CHIP1 and CHIP3 may be reduced. A collision between the data TDO which is output from the test unit TAP of the semiconductor chip CHIP2 and the data TDO which is transmitted from another semiconductor chip CHIP may be reduced.

If a test using the test unit TAP of the semiconductor chip CHIP3 is performed, for example, the test device sets the first switching units SWA and the second switching units SWB of the semiconductor chips CHIP1 and CHIP2 to a passing-through state. Since the data TDI or the like is not transmitted to the test units TAP of the semiconductor chips CHIP1 and CHIP2, a malfunction of the test units TAP of the semiconductor chips CHIP1 and CHIP2 may be reduced. A collision between the data TDO which is output from the test unit TAP of the semiconductor chip CHIP3 and the data TDO which is transmitted from another semiconductor chip CHIP may be reduced.

For example, after the test paths PT of the data TDI between the semiconductor chips CHIP1 and CHIP2 are set, and before the test path of the data TDO is set, the test paths PT of the data TDI between the semiconductor chips CHIP2 and CHIP3 may be set. After the test paths PT between the semiconductor chips CHIP1 and CHIP2 are set, and before the test path between the semiconductor chips CHIP2 and CHIP3 is set, the test using the test unit TAP of the semiconductor chip CHIP2 may be performed. The signal TRST may be transmitted from the TAP controller or the like in the test units TAP of the semiconductor chips CHIP on a lower side to the semiconductor chips CHIP on an upper side.

In FIG. 2 to FIG. 7, substantially the same effects as or similar effects to those in FIG. 1 may be obtained. For example, if data TDI indicating the expected value is received via any one of the plurality of signal paths, the select signal generating unit SGEN generates the select signals SELCTL indicating the signal paths PT through which the data TDI indicating the expected value is transmitted. The path selecting unit SEL selects the signal path PT which is used at the time of testing the semiconductor device SEM2 form among the signal paths PT, based on the select signals SELCTL received from the select signal generating unit SGEN.

Even if the signal paths PT which becomes redundant and through which the data supplied to the test input terminal TDI1 is transmitted, for example, one of the signal paths PT which is configured by one set of two pieces fails, a test for detecting a failure portion of the signal path between the semiconductor chips CHIP is performed. Therefore, the failure may be avoided by bypassing the failure portion. Yield of the semiconductor device SEM2 may increase.

The test circuit TESC includes the first switching units SWA which switch a transmission destination of the data TDI or the like, and the second switching unit SWB which switches a transmission source of the data TDO. Therefore, the test circuit TESC supplies the data TDI or the like to the test units TAP of the semiconductor chips CHIP which are targets to be tested, among the test units TAP of the plurality of semiconductor chips CHIP. For example, in the test circuit TESC, transmission of the data or the like to the test units TAP other than the semiconductor chips CHIP which are targets to be tested, among the test units TAP of the plurality of semiconductor chips CHIP, may be reduced.

The select signal generating unit SGEN includes the logical sum circuit OR3 which suppresses the update of the logic value stored in the flip flop circuits FFC if the logic value of the asserted control signals CNT are stored in the flip flop circuits FFC. For example, during a time period after the select signals SELCTL indicating the signal paths PT through which the data TDI indicating the expected value is transmitted are generated, it is possible to reduce the change of the select signals SELCTL depending on a change of the data TDI transmitted to the signal path PT. The select signals SELCTL indicating the signal paths PT through which data indicating the expected value is transmitted are stably supplied to the path selecting unit SEL.

Figure 8:
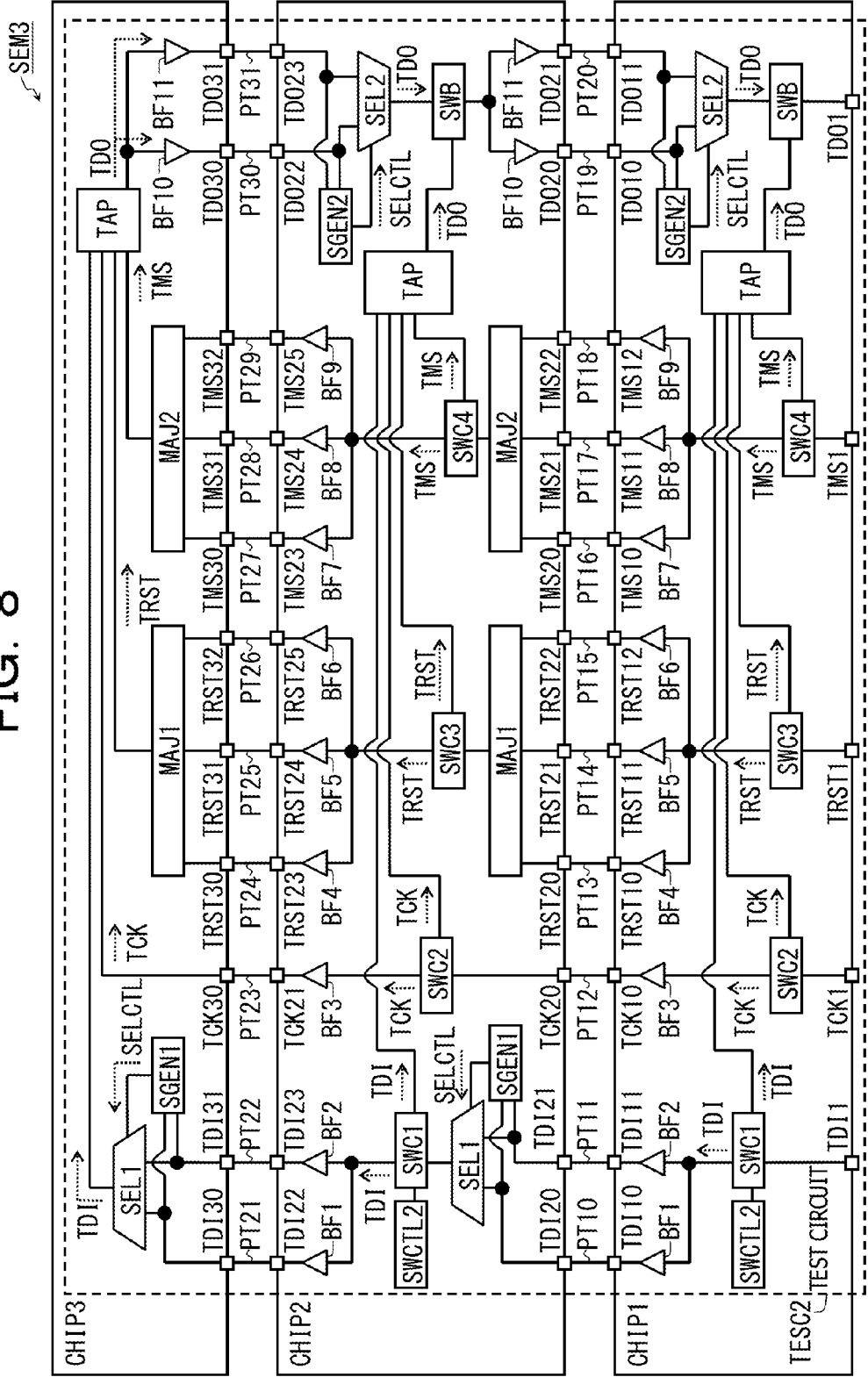
FIG. 8 illustrates another example of a test circuit.

FIG. 8 illustrates another example of a test circuit. In FIG. 8, the same or similar symbols or reference numerals may be attached to substantially the same elements as or similar elements to the elements illustrated in FIG. 1 to FIG. 7, and detailed description thereof may be omitted or reduced. A test circuit TESC2 tests a semiconductor device SEM3 which includes a plurality of semiconductor chips CHIP (CHIP1, CHIP2, CHIP3). The semiconductor device SEM3 may be substantially the same as or similar to the semiconductor device SEM2 illustrated in FIG. 2, except that the semiconductor device SEM3 includes the test circuit TESC2 instead of the test circuit TESC illustrated in FIG. 2. A control method of the test circuit TESC2 may be substantially the same as or similar to the control method of the test circuit TESC.

The test circuit TESC2 includes a switch control unit SWCTL2 and a first switching unit SWC, instead of the switch control unit SWCTL and the first switching units SWA which are illustrated in FIG. 2. The other configuration of the test circuit TESC2 may be substantially the same as or similar to the test circuit TESC illustrated in FIG. 2.

For example, the test circuit TESC2 includes the select signal generating units SGEN, the path selecting units SEL, the buffers BF, the first switching units SWC, the second switching units SWB, the switch control units SWCTL2, the majority determination selecting units MAJ, and the test units TAP corresponding to the JTAG.

For example, the switch control unit SWCTL2 sets operation states of the first switching units SWC1 to SWC4 and the second switching unit SWB, according to a state of a TAP controller in the test unit TAP. In FIG. 8, for the sake of easy viewing, signal lines among the switch control unit SWCTL2, the first switching units SWC2 to SWC4, the second switching unit SWB, the test units TAP and the like may be omitted.

For example, the switch control unit SWCTL2, according to the semiconductor chips CHIP which are targets to be tested, generates a control signal which controls an operation state of the first switching units SWC1 to SWC4, and a control signal which controls an operation state of the second switching unit SWB.

The first switching units SWC (SWC1 to SWC4) are set to one of an internal transmission state, a passing-through state, and a both-direction state, based on the control signal which is received from the switch control unit SWCTL2. In the internal transmission state, the data received by the first switching unit SWC, for example, the data TDI of the first switching unit SWC1 is transmitted to the test units TAP of the semiconductor chips CHIP thereof. In the passing-through state, the data received by the first switching unit SWC, for example, the data TDI of the first switching unit SWC1 is transmitted to another semiconductor chip CHIP. In the both-direction state, the data received by the first switching unit SWC, for example, the data TDI of the first switching unit SWC1 is transmitted to the test units TAP of the semiconductor chips CHIP thereof and another semiconductor chip CHIP1.

A coupling relationship between an input terminal and two output terminals of each of the first switching units SWC may be substantially the same as or similar to the first switching units SWA illustrated in FIG. 2. If the first switching units SWC of the semiconductor chip CHIP1 are set to the internal transmission state, the test unit TAP of the semiconductor chip CHIP1 receives the signals TDI, TCK, TMS, and TRST from the terminals TDI1, TCK1, TMS1, and TRST1, respectively. If the first switching units SWC of the semiconductor chip CHIP1 are set to the passing-through state, the signals TDI, TCK, TMS, and TRST supplied to the terminals TDI1, TCK1, TMS1, and TRST1 are transmitted to the semiconductor chip CHIP2.

If the first switching units SWC of the semiconductor chip CHIP1 are set to the both-direction state, the test unit TAP of the semiconductor chip CHIP1 receives the signals TDI, TCK, TMS, and TRST from the terminals TDI1, TCK1, TMS1, and TRST1, respectively. If the first switching units SWC of the semiconductor chip CHIP1 are set to the both-direction state, the signals TDI, TCK, TMS, and TRST supplied to the terminals TDI1, TCK1, TMS1, and TRST1 are transmitted to the semiconductor chip CHIP2.

For example, the switch control unit SWCTL2 may be provided to the inside of the test unit TAP, for example, the inside of a TAP controller of the test unit TAP. The first switching unit SWC4 or the like may be omitted.

For example, the test paths PT (PT10, PT11, or the like) through which the data supplied to the test input terminal TI1 is transmitted may be redundant by three or more signal paths. For example, the test circuit TESC2 may be embedded in the semiconductor device SEM3 in which two semiconductor chips CHIP are stacked, for example, the semiconductor device SEM3 in which the semiconductor chip CHIP2 is omitted. The test circuit TESC2 may be embedded in the semiconductor device SEM3 in which four or more semiconductor chips CHIP are stacked.

Figure 9:
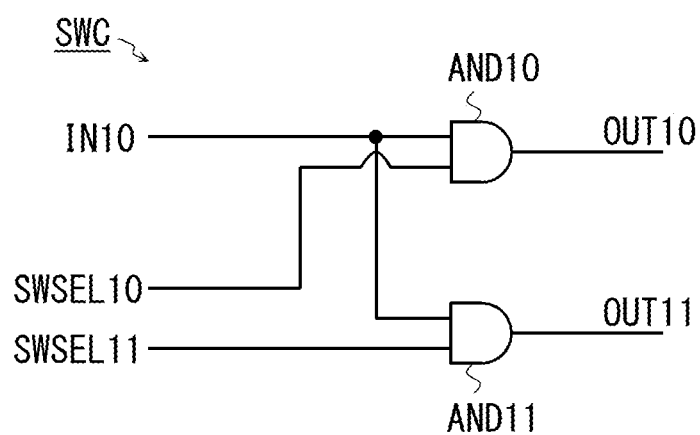
FIG. 9 illustrates an example of a first switching unit.

FIG. 9 illustrates an example of a first switching unit. The first switching unit illustrated in FIG. 9 may be the first switching unit SWC illustrated in FIG. 8. The first switching units SWC (SWC1 to SWC4) respectively include a logical product circuit AND10 and AND11. The logical product circuit AND10 calculates a logical product of data transmitted to two terminals IN10 and SWSEL10, and outputs the calculation results to a terminal OUT10. The logical product circuit AND11 calculates a logical product of data transmitted to two terminals IN10 and SWSEL11, and outputs the calculation results to a terminal OUT11.

For example, the terminals SWSEL10 and SWSEL11 receive control signals from the switch control unit SWCTL2. If the control signals received at the terminals SWSEL10 and SWSEL11 are respectively a logic value "1" and a logic value "0", for example, in the internal transmission state, a signal received at the terminal IN10 is output from the terminal OUT10, and the terminal OUT11 is maintained as a logic value "0". If the control signals received in the terminals SWSEL10 and SWSEL11 are respectively a logic value "0" and a logic value "1", for example, in the passing-through state, a signal received at the terminal IN10 is output from the terminal OUT11, and the terminal OUT10 is maintained as a logic value "0".

If the control signals received at the terminals SWSEL10 and SWSEL11 are a logic value "1", for example, in the both-direction state, a signal received in the terminal IN10 is output from both the terminal OUT10 and OUT11. For example, in the semiconductor chip CHIP2, the terminal IN10 of the first switching unit SWC1 is coupled to the output terminal of the path selecting unit SEL1. The terminal OUT10 is coupled to a test input terminal (terminal which receives the data TDI) of the test unit TAP, and the terminal OUT11 is coupled to buffers BF1 and BF2.

Substantially the same effects as in FIG. 2 to FIG. 7 may be obtained also in FIG. 8 and FIG. 9. For example, even if the signal paths PT which become redundant and through which the data supplied to the test input terminal TDI1 is transmitted, for example, one of the signal paths PT which is configured by one set of two pieces fails, a test for detecting a failure portion of the signal path between the semiconductor chips CHIP is performed. Therefore, the failure may be avoided by bypassing the failure portion. Yield of the semiconductor device SEM3 may increase.

The test circuit TESC2 includes the first switching units SWC which switch a transmission destination of the data TDI or the like. For example, if the same data is set in a data register or the like in the test unit TAP of the plurality of semiconductor chips CHIP, the test circuit TESC2 supplies the data TDI or the like to the test units TAP of the plurality of semiconductor chips CHIP through a broadcast. As a result, time for setting data to the data register or the like in the test unit TAP may be reduced, and test time of the semiconductor device SEM3 may be reduced.

Figure 10:
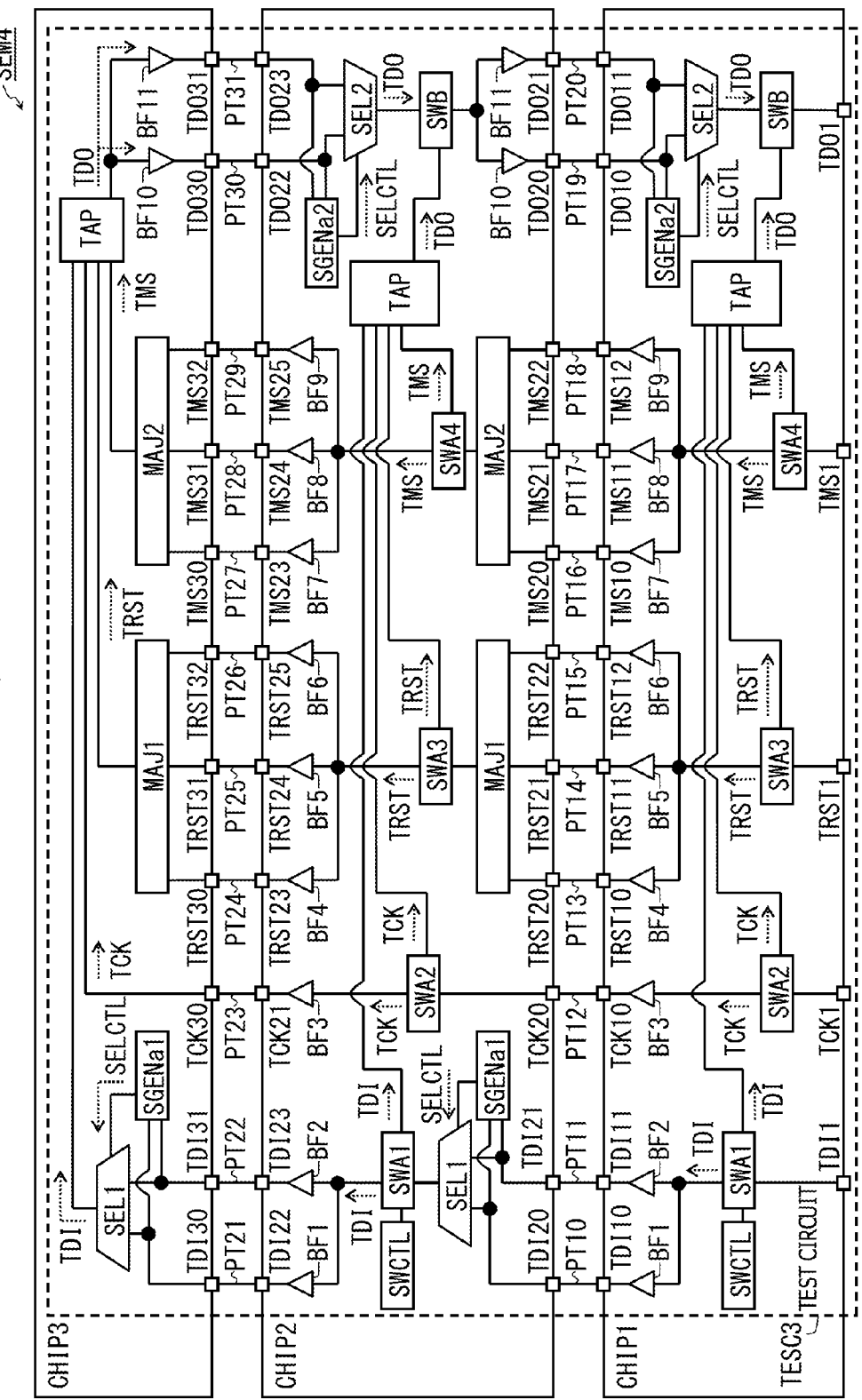
FIG. 10 illustrates another example of a test circuit.

FIG. 10 illustrates another example of a test circuit. In FIG. 10, the same or similar symbols or reference numerals will be attached to substantially the same elements as or similar elements to the elements illustrated in FIG. 1 to FIG. 9, and detailed description thereof may be omitted or reduced. A test circuit TESC3 tests a semiconductor device SEM4 which includes a plurality of semiconductor chips CHIP (CHIP1, CHIP2, CHIP3). The semiconductor device SEM4 may be substantially the same as or similar to the semiconductor device SEM2 illustrated in FIG. 2, except that the semiconductor device SEM4 includes the test circuit TESC3 instead of the test circuit TESC illustrated in FIG. 2. A control method of the test circuit TESC3 may be substantially the same as or similar to the control method of the test circuit TESC.

The test circuit TESC3 includes select signal generating units SGENa (SGENa1, SGENa2), instead of the select signal generating unit SGEN (SGEN1, SGEN2) illustrated in FIG. 2. The other configuration of the test circuit TESC3 may be substantially the same as or similar to the test circuit TESC illustrated in FIG. 2.

For example, the test circuit TESC3 includes the select signal generating units SGENa, the path selecting units SEL, the buffers BF, the first switching units SWA, the second switching units SWB, the switch control units SWCTL, the majority determination selecting units MAJ, and the test units TAP corresponding to the JTAG.

If a plurality of signal paths PT through which the data TDI indicating the expected value is transmitted exist, the select signal generating units SGENa generate the select signals SELCTL indicating one of the plurality of signal paths PT through which the data TDI indicating the expected value is transmitted.

For example, the switch control unit SWCTL may be provided inside the test unit TAP, for example, inside a TAP controller in the test unit TAP. The first switching unit SWA4 or the like may be omitted.

For example, the test circuit TESC3 may include the switch control unit SWCTL2 and the first switching units SWC which are illustrated in FIG. 8, instead of the switch control unit SWCTL and the first switching units SWA.

The test paths PT (PT10, PT11, or the like) through which the data supplied to the test input terminal TI1 is transmitted may be redundant by three or more signal paths. For example, the test circuit TESC3 may be embedded in the semiconductor device SEM4 in which two semiconductor chips CHIP are stacked, for example, the semiconductor device SEM4 in which the semiconductor chip CHIP2 is omitted. The test circuit TESC3 may be embedded in the semiconductor device SEM4 in which four or more semiconductor chips CHIP are stacked.

Figure 11:
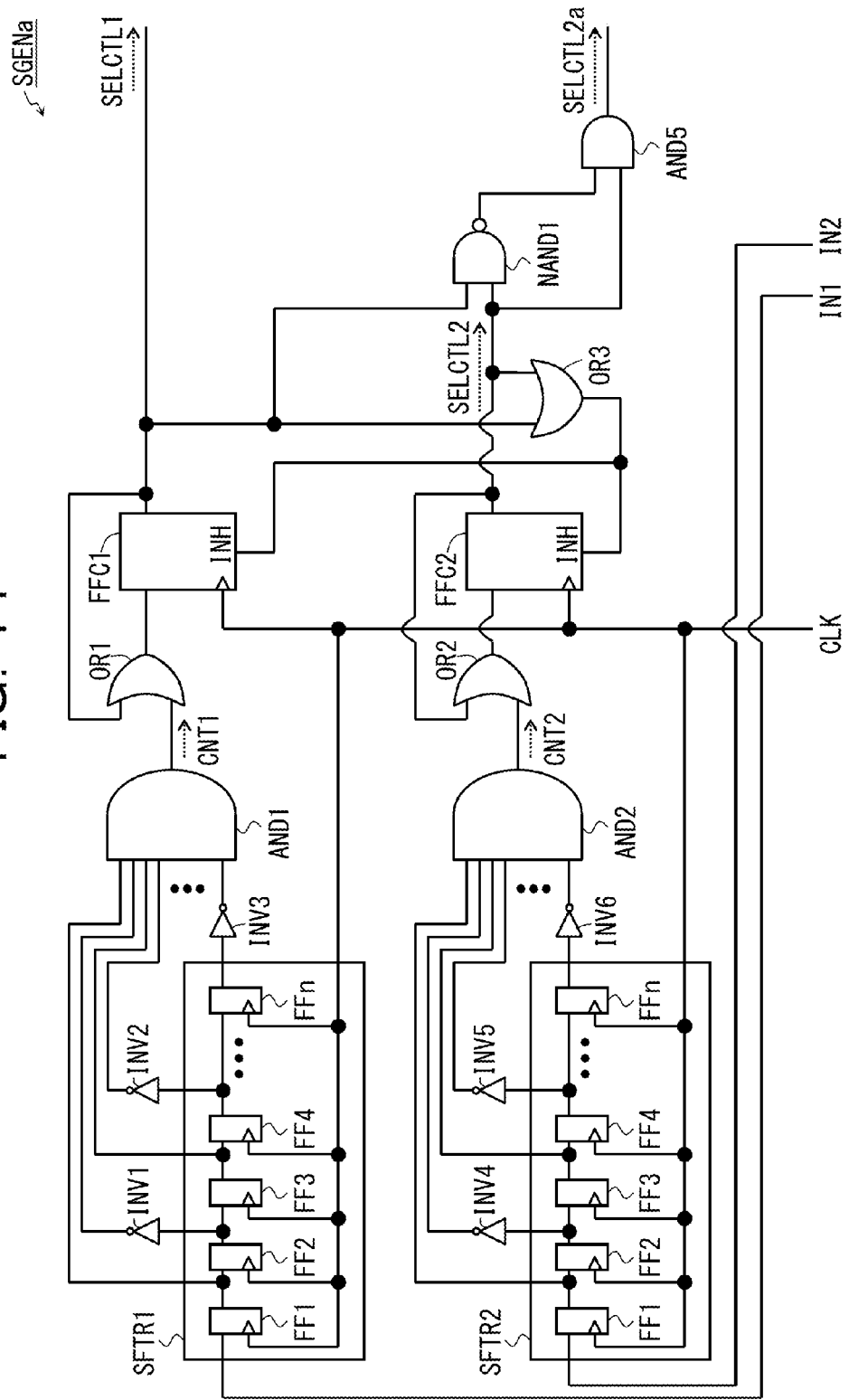
FIG. 11 illustrates an example of a select signal generating unit.

FIG. 11 illustrates an example of a select signal generating unit. The select signal generating unit illustrated in FIG. 11 may be the select signal generating unit SGENa illustrated in FIG. 10. A coupling destination or the like of terminals CLK, IN1, and IN2 illustrated in FIG. 11 may be substantially the same as or similar to the select signal generating unit SGEN illustrated in FIG. 3. In the select signal generating units SGENa, a negative logical product circuit NAND1 and a logical product circuit AND5 are added to the select signal generating unit SGEN illustrated in FIG. 3. The other configuration of the select signal generating units SGENa may be substantially the same as or similar to the select signal generating unit SGEN illustrated in FIG. 3.

The select signal generating units SGENa respectively include shift registers with n bits SFTR1 and SFTR2, the logical product circuits AND1, AND2, and AND5, the negative logical product circuit NAND1, the logical sum circuits OR1, OR2, and OR3, and the flip flop circuits FFC1 and FFC2. Here, n is an integer equal to or higher than 2. In the select signal generating units SGENa, the select signal SELCTL2a is transmitted to the path selecting unit SEL, instead of the select signal SELCTL2.

The negative logical product circuit NAND1 receives the select signals SELCTL1 and SELCTL2 from the flip flop circuits FFC1 and FFC2 at two input terminals thereof, respectively. The negative logical product circuit NAND1 calculates a negative logical product of the select signals SELCTL1 and SELCTL2 received in the two input terminals thereof, and outputs the calculation results to the logical product circuit AND5.

The logical product circuit AND5 respectively receives an output signal of the negative logical product circuit NAND1 and the select signal SELCTL2, at the two input terminals thereof, respectively. The logical product circuit AND5 calculates a logical product of the data received in the two input terminals, and transmits the calculation results to the path selecting unit SEL as the select signal SELCTL2a.

For example, if both the select signals SELCTL1 and SELCTL2 have a logic value of "0", the select signals SELCTL1 and SELCTL2a with a logic value of "0" are transmitted to the path selecting unit SEL. For example, if the select signals SELCTL1 and SELCTL2 are respectively a logic value of "0" and a logic value of "1", the select signal SELCTL1 with a logic value of "0" and the select signal SELCTL2a with a logic value of "1" are transmitted to the path selecting unit SEL. In addition, for example, if the select signals SELCTL1 and SELCTL2 are respectively a logic value of "1" and a logic value of "0", the select signal SELCTL1 with a logic value of "1" and the select signal SELCTL2a with a logic value of "0" are transmitted to the path selecting unit SEL.

If both the select signals SELCTL1 and SELCTL2 have a logic value of "1", the select signal SELCTL1 with a logic value of "1" and the select signal SELCTL2a with a logic value of "0" are transmitted to the path selecting unit SEL.

Even if a plurality of signal paths PT through which the data TDI indicating the expected value is transmitted exist, the select signal generating units SGENa respectively transmit the select signals SELCTL indicating one of the plurality of signal paths PT through which the data TDI indicating the expected value is transmitted, to the path selecting unit SEL. For example, in the path selecting unit SEL illustrated in FIG. 3, if both the select signals SELCTL1 and SELCTL2 have a logic value of "1", waveforms of the data which is output from the path selecting unit SEL may be degraded due to a difference or the like of delay time of the data which is transmitted to the terminals IN1 and IN2.

In the select signal generating units SGENa, both the select signals SELCTL1 and SELCTL2a may not become a logic value of "1". Therefore, degradation of the waveform of the data which is output from the path selecting unit SEL may be reduced.

Substantially the same effects as in FIG. 2 to FIG. 7 may be obtained also in FIG. 10 and FIG. 11. For example, even if the signal paths PT which become redundant and through which the data supplied to the test input terminal TDI1 is transmitted, for example, one of the signal paths PT which is configured by one set of two pieces fails, a test for detecting a failure portion of the signal path between the semiconductor chips CHIP is performed. Therefore, the failure may be avoided by bypassing the failure portion. Yield of the semiconductor device SEM4 may increase.

If a plurality of signal paths PT through which the data TDI indicating the expected value is transmitted exist, the select signal generating units SGENa respectively generate the select signals SELCTL indicating one of the plurality of signal paths PT through which the data TDI indicating the expected value is transmitted. For example, both the select signals SELCTL1 and SELCTL2a which are transmitted to the path selecting unit SEL may not become a logic value of "1". Therefore, degradation of the waveforms of the data which is output from the path selecting unit SEL may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A test circuit which is provided to a semiconductor device including a plurality of semiconductor chips, and tests the semiconductor device, comprising:
   a test input terminal configured to receive data for testing the semiconductor device from outside the semiconductor device;
   a plurality of signal paths provided between at least one semiconductor chip included in the plurality of semiconductor chips and another semiconductor chip included in the plurality of semiconductor chips, data, which is supplied to the test input terminal, being transmitted through the plurality of signal paths;
   a select signal generator, provided in the at least one semiconductor chip and coupled to the another semiconductor chip via the plurality of signal paths, configured to generate, when receiving data having logic values equal to expected values which are set to the select signal generator for a test of the semiconductor device via one or more signal paths included in the plurality of signal paths, a select signal indicating the one or more signal paths which transmit the data by comparing the data having the logic values equal to the expected values transmitted via the one or more signal paths with the expected values; and
   a path selector, provided in the at least one semiconductor chip and coupled to the plurality of signal paths, configured to select, based on the select signal, signal paths to be used at a time of testing the semiconductor device from among the plurality of signal paths.

2. The test circuit according to claim 1, wherein the select signal generator includes: data storages, provided for each of the plurality of signal paths, configured to store respective data received via the plurality of signal paths; and a first controller configured to assert, when data stored in one of the data storages indicates the expected values, control signals corresponding to signal paths which transmit the data indicating the expected values from among control signals corresponding to each of the plurality of signal paths; a select signal storage configured to store a logic value of each of the control signals, and output the select signal based on the logic value; and a second controller configured to suppress, if a logic value of an asserted control signal is stored in the select signal storage, an update of the logic value stored in the select signal storage.

3. The test circuit according to claim 1, wherein the select signal generator configured to generate, when the one or more signal paths which transmit the data indicating the expected values exist as plural, the select signal indicating one of the one or more signal paths which transmit the data indicating the expected values.

4. The test circuit according to claim 1, further comprising:
   a test unit, provided for each of the semiconductor chips, configured to test the semiconductor device;
   a test output terminal configured to output data corresponding to a test result of the semiconductor device to outside the semiconductor device;
   a first switch, provided in a first semiconductor chip which corresponds to at least one of the semiconductor chips, configured to be set to one of a state in which data transmitted from the test input terminal is transmitted to the test unit of the first semiconductor chip, and a state in which data transmitted from the test input terminal is transmitted to a second semiconductor chip, which is coupled to the first semiconductor chip and is one of the semiconductor chips; and a second switch, provided in the first semiconductor chip, configured to be set to one of a state in which data transmitted from the test unit of the first semiconductor chip is transmitted to the test output terminal, and a state in which data transmitted from the second semiconductor chip is transmitted to the test output terminal.

5. The test circuit according to claim 1, further comprising:

a test unit, provided for each of the semiconductor chips, configured to test the semiconductor device; a test output terminal configured to output data corresponding to a test result of the semiconductor device to outside the semiconductor device;

a first switch, provided in a first semiconductor chip which corresponds to at least one of the semiconductor chips, configured to be set to one of a state in which data transmitted from the test input terminal is transmitted to the test unit of the first semiconductor chip, a state in which data transmitted from the test input terminal is transmitted to a second semiconductor chip, which is coupled to the first semiconductor chip and is one of the semiconductor chips, and a state in which data transmitted from the test input terminal is transmitted to the test unit of the first semiconductor chip and the second semiconductor chip; and a second switch, provided in the first semiconductor chip, configured to be set to one of a state in which data transmitted from the test unit of the first semiconductor chip is transmitted to the test output terminal, and a state in which data transmitted from the second semiconductor chip is transmitted to the test output terminal.

6. A method of controlling a test circuit, the test circuit comprises:

a test input terminal configured to receive data for testing a semiconductor device including semiconductor chips from outside the semiconductor device;

a plurality of signal paths provided between at least one semiconductor chip included in the semiconductor chips and another semiconductor chip included in the semiconductor chips, data which is supplied to the test input terminal being transmitted through the plurality signal paths;

a select signal generator, provided in the at least one semiconductor chip and coupled to the another semiconductor chip via the plurality of signal paths, configured to generate, when receiving data having logic values equal to expected values which are set to the select signal generator for a test of the semiconductor device via one or more signal paths included in the plurality of signal paths, a select signal indicating the one or more signal paths which transmit the data by comparing the data having the logic values equal to the expected values transmitted via the one or more signal paths with the expected values; and a path selector, provided in the at least one semiconductor chip and coupled to the plurality signal paths, configured to select, based on the select signal, signal paths to be used at the time of testing the semiconductor device from among the plurality of signal paths, a test device which tests the semiconductor device performs operations of:

supplying data having a logical value which is the same as the expected values to the test input terminal; and supplying data for testing the semiconductor device to the test input terminal after the path selector selects the signal paths to be used at the time of testing the semiconductor device.

* * * * *